(12) United States Patent
Eguchi

(10) Patent No.: US 7,456,922 B2
(45) Date of Patent: Nov. 25, 2008

(54) ELECTROOPTIC DEVICE, SUBSTRATE THEREFOR, METHOD FOR MAKING THE ELECTROOPTIC DEVICE, AND ELECTRONIC APPARATUS

(75) Inventor: Tsukasa Eguchi, Showa-machi (JP)

(73) Assignee: Seiko Epson Corporation, Tokyo (JP)

( * ) Notice: Subject to any disclaimer, the term of this patent is extended or adjusted under 35 U.S.C. 154(b) by 329 days.

(21) Appl. No.: 11/462,227

(22) Filed: Aug. 3, 2006

(65) Prior Publication Data

US 2007/0058099 A1    Mar. 15, 2007

(30) Foreign Application Priority Data

Sep. 9, 2005    (JP)    ............... 2005-261715
Jul. 7, 2006    (JP)    ............... 2006-187522

(51) Int. Cl.
*G02F 1/1333* (2006.01)

(52) U.S. Cl. ............................... 349/138
(58) Field of Classification Search ............ 349/138
See application file for complete search history.

(56) References Cited

U.S. PATENT DOCUMENTS 7,130,009 B2 *  10/2006  Saigo et al. ............... 349/141
7,215,387 B2 *   5/2007  Yang et al. ................ 349/43
7,271,867 B2 *   9/2007  Kim et al. ................. 349/138

FOREIGN PATENT DOCUMENTS

JP    A 4-163528    6/1992
JP    A 10-39334    2/1998
JP    A 2003-308027    10/2003

OTHER PUBLICATIONS

M. Kashiwabara; "29.5L: Late-News Paper: Advanced AM-OLED Display Based on White Emitter with Microcavity Structure;" Society for Information Display Digest, 2004, pp. 1017-1019.

* cited by examiner

*Primary Examiner*—David C. Nelms
*Assistant Examiner*—Phu Vu
(74) *Attorney, Agent, or Firm*—Oliff & Berridge, PLC

(57) ABSTRACT

An electrooptic device includes a substrate and plurality of pixel units. Each pixel unit includes a pixel electrode; an active element; a conductive layer below the pixel electrode connecting the active element to the pixel electrode; a resin film between the active element and the pixel electrode and between the conductive layer and the pixel electrode, having a small hole overlapping part of the conductive layer; a first insulating film between the resin film and the conductive layer and between the resin film and the active element, overlapping the conductive layer and the active element and having a first hole inside the small hole having a diameter equal to or smaller than the bottom of the small hole; and a second insulating film between the resin film and the pixel electrode, having a second hole continuous to the first hole forming a contact hole together with the first hole.

11 Claims, 13 Drawing Sheets

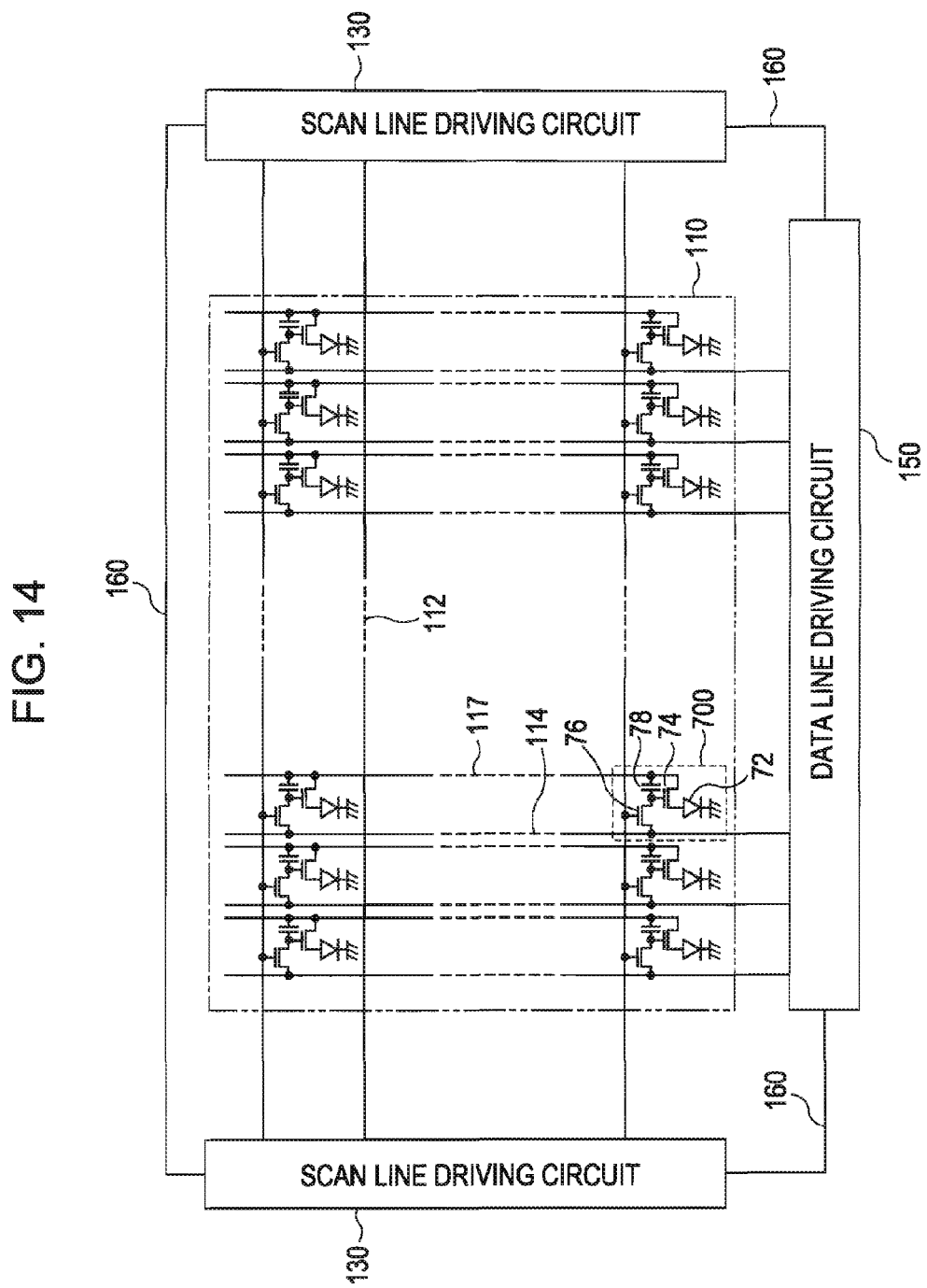

ELECTROOPTIC DEVICE, SUBSTRATE THEREFOR, METHOD FOR MAKING THE ELECTROOPTIC DEVICE, AND ELECTRONIC APPARATUS

The entire disclosure of Japanese Application Nos. 2005-261715, filed Sep. 9, 2005 and 2006-187522, filed Jul. 7, 2006 are expressly incorporated by reference herein.

BACKGROUND

1. Technical Field

The present invention relates to the technical field pertaining to substrates for electrooptic devices such as organic electro-luminescence (EL) devices or liquid crystal devices, electrooptic devices including such substrates, methods for making the electrooptic devices, and electronic apparatuses including the electrooptic devices.

2. Related Art

Electrooptic devices of this type display images by controlling switching of pixel electrodes by using pixel switching elements in the individual pixel sections through an active matrix driving technology, for example.

On a substrate, a pixel electrode is formed in a layer different from that of a pixel switching element, and a conductive layer, a relay layer, or a relay electrode is formed to provide electrical connection between the pixel electrode and the pixel switching element. Then, an organic resin film that can form a surface with satisfactory flatness is formed to provide interlayer insulation between the pixel electrode and the pixel switching element and the pixel electrode and the conductive layer. The surface of the pixel electrode maintains satisfactory flatness since the pixel electrode is formed above the organic resin film.

JP-A-10-39334 and JP-A4-163528 each disclose a technology for forming an inorganic insulating film composed of, for example, a nitrogen-containing material above the organic resin film and below the pixel electrode such that, during the manufacture or operation of electrooptic devices, film separation and cracking of the pixel electrode due to swelling of the water-absorbent organic resin film can be prevented.

In particular, according to JP-A-10-39334 and JP-A-4-163528, a small hole is formed in an organic resin film to expose the surface of a conductive layer, and an inorganic insulating film is continuously formed from inside the small hole to outside the small hole such that sidewall of the small hole is covered with the film. In this case, the inorganic insulating film on the sidewall inside the small hole forms a contact hole, and the pixel electrode electrically connects to the conductive layer through this contact hole without making contact with the organic resin film.

Another inorganic insulating film composed of, for example, a nitrogen-containing material is formed above the pixel switching elements and the conductive layers but below the organic resin film to protect the switching element. In a plan view, this another inorganic insulating film is patterned prior to formation of the organic resin film such that the surface of a portion of the conductive layer to be electrically connected to the pixel electrode is exposed from the another inorganic insulating film in the region where the another inorganic insulating film overlaps the conductive layer.

JP-A-2003-308027 discloses a structure in which a pixel electrode is electrically directly connected to a pixel switching element through a contact hole formed in a small hole in the organic resin film.

In pages 1017 to 1019 of Society for Information Display 2004 Digest (2004), a so-called micro cavity structure used in an organic EL device that uses an organic EL as an electrooptic material is disclosed as an example of the electrooptic device. According to this micro cavity structure, the organic EL is composed of a material that can emit light corresponding to white, and in the pixel unit, a reflector film is disposed below the pixel electrode. Moreover, color layers for red, green, and blue are formed on the substrate so that each color layer in the corresponding pixel unit faces the pixel electrode with the organic EL therebetween.

However, according to the technology disclosed in JP-A-10-39334 and JP-A-4-163528, the organic resin film comes into contact with the surface of the conductive layer exposed in the another inorganic resin film disposed below the organic resin film. Thus, after forming the small hole, an organic substance derived from the organic resin film may remain on the surface of the conductive layer, and this increases the resistance related to the electrical connection between the pixel electrode and the conductive layer, i.e., the contact resistance, and makes the contact resistance non-uniform among contact holes, thereby disadvantageously degrading the contact properties.

According to the technology disclosed in JP-A-2003-308027, a signal line or an electrode electrically connected to a pixel switching element lies in the same layer as the pixel electrode, resulting in a decreased aperture ratio. In order to overcome this problem, cumbersome procedures such as modifying design of wiring that constitutes the pixel unit are necessary, and the cost required for the production of the electrooptic device may thus increase.

Moreover, according to the micro cavity structure disclosed in pages 1017 to 1019 of Society for Information Display 2004 Digest, the reflector film comes into direct contact with the pixel electrode. Thus, it becomes necessary to prevent separation of the reflector film resulting from pinholes in or deposited dust on the surface of the reflector film during formation of the pixel electrode.

SUMMARY

An advantage of the invention is that it provides an electrooptic device that can provide high-quality image display by improving the contact properties related to the electrical connection between the pixel electrode and the conductive layer while preventing the separation and cracking of the pixel electrode and the like, a substrate for the electrooptic device, a method for making the electrooptic device, and various types of electronic apparatuses having the electrooptic device.

A first aspect of the invention provides an electrooptic device including a substrate and a plurality of pixel units. Each pixel unit includes a pixel electrode; an active element for active control of the pixel electrode; a conductive layer that is formed below the pixel electrode and that connects the active element to the pixel electrode; an organic resin film that provides interlayer insulation between the active element and the pixel electrode and between the conductive layer and the pixel electrode, the organic resin film having a small hole that overlaps part of the conductive layer in a plan view; a first inorganic insulating film disposed between the organic resin film and the conductive layer and between the organic resin film and the active element such that the first inorganic insulating film overlaps the conductive layer and the active element in a plan view, the first inorganic insulating film having a first hole inside the small hole in a plan view, the first hole having a diameter equal to or smaller than the bottom of the small hole; and a second inorganic insulating film disposed between the organic resin film and the pixel electrode, the second inorganic insulating film having a second hole that is continuous to the first hole and that forms a contact hole together with the first hole. The pixel electrode is formed in a continuous manner from inside the contact hole to outside the contact hole such that the pixel electrode is electrically connected to the conductive layer exposed inside the first hole.

In this electrooptic device, for example, the pixel units are aligned in a predetermined pattern in an image display region on the substrate. During the operation by, for example, active matrix driving, the switching control and ON/OFF control of the pixel electrode composed of, for example, a transparent conductive film, is done by the active element. Alternatively, the active element may control the current supplied to the pixel electrode or the voltage applied to the pixel electrode. In each pixel unit, the active element is electrically connected to the pixel electrode through the conductive layer. For example, the drain of a TFT, which is an example of the active element, is connected to the pixel electrode through the conductive layer. Note that the substrate may be composed of a transparent material such as quartz, glass, or a semiconductor substrate, or a transparent sheet material such as plastic. The substrate is not limited to the transparent substrate and may be formed of a light-shielding material.

The conductive layer is formed as a source or drain electrode of a TFT, which is an example of the active element, or may be disposed in the electrical path between the active element and the pixel electrode so as to function as a relay wire or relay electrode for relaying electrical connection between the active element and the pixel electrode.

In this electrooptic device, it is possible to form a multilayer-structure pixel unit in which active elements such as a pixel electrode and a pixel switching element, electrodes, and other associated components are formed in layers of different levels. Thus, for example, when compared with the structure of the pixel unit disclosed in JP-A-2003-308027, the aperture ratio can be increased. In this specification, the region in the pixel or pixel unit where light can be emitted from or where light can pass through is referred to as "opening region". The area ratio of the opening region to the entire region of the pixel (i.e., the opening region and the non-opening region) is referred to as the "aperture ratio".

The pixel electrode is isolated from the active element and the conductive layer disposed below the pixel electrode by an organic resin film composed of a photosensitive resin such as acryl. The first inorganic insulating film composed of a nitrogen-containing material is formed below the organic resin film and above the active element and the conductive layer. The first inorganic insulating film is provided as a protective film for preventing the water in the water-absorbent organic resin film from further dispersing into the active element and the conductive layer. The first inorganic insulating film is formed to overlap the active element and the conductive layer in a plan view. Thus, the surface of the conductive layer is substantially completely covered with the first inorganic insulating film except in part where electrical connection to the pixel electrode is needed. Thus, the conductive layer does not generally come into direct contact with the organic resin film. The first inorganic insulating film is preferably formed as a base of the organic resin film so that the first inorganic insulting film can prevent water below from entering the organic resin film.

The small hole for exposing the surface of the conductive layer in the organic resin film and penetrating the organic resin film is formed in the organic resin film. At the bottom of the small hole, a first hole that penetrates the first inorganic insulating film is formed inside the small hole in a plan view. As a result, the surface of the conductive layer is exposed inside the first hole.

The second inorganic insulating film composed of a nitrogen-containing material is formed above the organic resin film. The second inorganic insulating film is formed continuously from inside the small hole to outside the small hole while covering the sidewall of the small hole. The second hole that continues from the first hole is formed in the small hole such that the sidewall of the second hole is made with the second inorganic insulating film. Thus, the contact hole is formed in the small hole.

The pixel electrode is formed in a continuous manner from the surface of the conductive layer exposed in the contact hole to outside the contact hole. In this manner, the second inorganic insulating film is disposed between the organic resin film and the pixel electrode in a continuous manner from inside the small hole to outside the small hole. Thus, a structure in which the pixel electrode is substantially completely prevented from coming into contact with the organic resin film can be obtained.

The second inorganic insulating film is preferably formed to substantially completely cover the surface of the organic resin film. As a result, water is prevented from entering the organic resin film from above, and water from the organic resin film is prevented from dispersing into the components above the organic resin film. In this electrooptic device, since water is prevented from entering from above and from below the organic resin film, swelling of the organic resin film can be prevented. Thus, separation and cracking of the pixel electrode due to swelling of the organic resin film can be prevented.

During the production of the electrooptic device, the organic resin film and the small hole are formed while the surface of the conductive layer is covered and protected with the first inorganic resin film. After the formation of the small hole, the first hole is formed so that, as described above, the structure in which the organic resin film does not generally make contact with the surface of the conductive layer is obtained.

Thus, Even when an organic substance derived from the organic resin film remains in the small hole after the formation of the small hole, such a substance can be removed as the first hole is formed by, for example, etching. In other words, during the formation of the first hole, the remaining substance is also removed by etching or the like. Furthermore, when the second hole is formed instead of or in addition to the first hole, the remaining substance is also removed by etching or the like. Thus, in this electrooptic device, the increase in contact resistance at the contact hole caused by the organic substance remaining inside the contact hole can be prevented, and it becomes possible to make the contact resistance of the individual contact holes substantially uniform. As a result, the contact properties of the contact holes can be improved.

Thus, according to the electrooptic device of this aspect, high-quality image display and high reliability can be obtained by improving the contact properties of the contact holes as described above while preventing film separation and cracking of the pixel electrode.

According to one embodiment of the electrooptic device, the organic resin film is composed of a photosensitive resin.

According to this embodiment, the organic resin film can be made from the organic resin film by, for example, spin coating so that the surface of the organic resin film has satisfactory flatness. Thus, when the pixel electrode is formed on the organic resin film, the surface of the pixel electrode also exhibits satisfactory flatness.

The small hole can be easily formed in the organic resin film by exposure and development, for example.

According to another embodiment of the electrooptic device, at least one of the first and second inorganic insulating films is composed of a material that contains nitrogen. By forming one or both of the first and second inorganic insulating films from, for example, a silicon nitride (SiN) film, waterproof property can be imparted.

According to yet another embodiment of the electrooptic device, each pixel unit of the electrooptic device further includes a counter electrode that faces the pixel electrode; and an electrooptic material interposed between the counter electrode and the pixel electrode. In this manner, for example, when the electrooptic material is composed of liquid crystal, the electrooptic device can be used as a liquid crystal device. In this case, in each pixel unit, the pixel electrode is driven by a pixel switching element functioning as an active element so that a potential defined by the potentials of the pixel electrode and the counter electrode is applied to the electrooptic material. As a result, the light that is emitted from the light source and enters the electrooptic material via the other substrate on which the counter electrode is formed is modulated.

Alternatively, the electrooptic material may be composed of a light-emitting material such as organic EL so that the electrooptic device functions as an organic EL device or the like. In this case, in each pixel unit, a plurality of active elements are provided for current-drive, and these active elements drive the pixel electrode to allow the electrooptic material, e.g., organic EL, to emit light by application of current.

In this electrooptic device, the second inorganic insulating film prevents water from dispersing into the electrooptic material through the pixel electrode from the organic resin film. Thus, the reliability of the electrooptic device can be improved.

When the electrooptic device is a liquid crystal device or the like, the other substrate onto which the counter electrode is formed as well as the counter electrode may be composed of a transparent material or light-shielding material. However, when the electrooptic device is an organic EL device or the like, the counter electrode may be formed on the same substrate on which the pixel electrode is formed such that the electrooptic material is interposed between the two electrodes.

According to the embodiment that includes the electrooptic material, the electrooptic material is preferably composed of organic EL so that the electrooptic device can function as an organic EL device.

According to yet another embodiment of the electrooptic device, each pixel unit of the electrooptic device further includes a reflector film disposed above the organic resin film and below the second inorganic insulating film, the reflector film overlapping part of the second inorganic insulating film and the pixel electrode in a plan view. In this manner, when the electrooptic material of the electrooptic device is liquid crystal, the electrooptic device can be used as a reflective liquid crystal device in which the light modulated by the electrooptic material passes through the pixel electrode and is reflected at the reflector film in each pixel unit.

Alternatively, when the electrooptic material is composed of organic EL, the electrooptic device can be used as a top-emission organic EL device in which the light emitted from the organic EL passes through the pixel electrode, is reflected at the reflector film, and is emitted to outside environment.

In this embodiment, the second inorganic insulating film covers the surface of the reflector film below the pixel electrode and is thus interposed between the pixel electrode and the reflector film. Thus, it becomes possible to prevent separation of the reflector film resulting from pinholes in or deposited dust on the surface of the reflector film during formation of the pixel electrode.

This embodiment that includes the reflector film may further include a counter electrode that faces the pixel electrode and an electrooptic material interposed between the counter electrode and the pixel electrode in each pixel unit. The electrooptic device may also include three types of color layers, i.e., a red (R) color layer, a green (G) color layer, and a blue (B) color layer, each of which opposes the pixel electrode of the corresponding pixel unit with the electrooptic material disposed therebetween. The thickness of the pixel electrode may be made different depending on the type of the corresponding color layer such that the thicknesses of the pixel electrodes corresponding to the three types of color layers are different from one another. In this manner, a micro cavity structure can be formed in each pixel unit when the electrooptic material of the electrooptic device is composed of, for example, organic EL.

A second aspect of the invention provides a substrate for an electrooptic device, including a substrate and a plurality of pixel units disposed on the substrate. Each pixel unit includes a pixel electrode; an active element for active control of the pixel electrode; a conductive layer that is formed below the pixel electrode and that connects the active element to the pixel electrode; an organic resin film that provides interlayer insulation between the active element and the pixel electrode and between the conductive layer and the pixel electrode, the organic resin film having a small hole that overlaps part of the conductive layer in a plan view; a first inorganic insulating film disposed between the organic resin film and the conductive layer and between the organic resin film and the active element such that the first inorganic insulating film overlaps the conductive layer and the active element in a plan view, the first inorganic insulating film having a first hole inside the small hole in a plan view, the first hole having a diameter equal to or smaller than the bottom of the small hole; and a second inorganic insulating film disposed between the organic resin film and the pixel electrode, the second inorganic insulating film having a second hole that is continuous to the first hole and that forms a contact hole together with the first hole. The pixel electrode is formed in a continuous manner from inside the contact hole to outside the contact hole such that the pixel electrode is electrically connected to the conductive layer exposed inside the first hole.

By using this substrate, it becomes possible to improve the contact properties of the contact hole while preventing the film separation or cracking of the pixel electrode as with the electrooptic device of the first aspect described above.

A third aspect of the invention provides an electronic apparatus that includes the electrooptic device, for example, an organic EL device.

Since the electronic apparatus of the third aspect includes the electrooptic device, it can be used as various electronic apparatuses such as television sets, cellular phones, electronic notebooks, word processors, videotape recorders of a view finder type or a monitor direct-view type, work stations, video phones, POS terminals, and touch panels while attaining high reliability and high-quality image display. Moreover, the electronic apparatus can be used as an exposure head of image-forming apparatuses such as printers, copy machines, and facsimile machines.

A fourth aspect of the invention provides a method for making an electrooptic device, the method including a first step of forming an active element for each of the pixel units on a substrate; a second step of forming a conductor layer electrically connected to the active element; a third step of forming a first inorganic insulating film above the conductive layer and the active element such that the first inorganic insulating film overlaps the active element and the conductive layer in a plan view; a fourth step of forming an organic resin film on the first inorganic insulating film; a fifth step of forming a small hole that penetrates the organic resin film and reaches a surface of the first inorganic insulating film, the small hole being formed in an organic resin film at a position that overlaps part of the conductive layer in a plan view; a sixth step of forming a second inorganic insulating film on the organic resin film so as to cover a sidewall of the small hole; a seventh step of forming a first hole inside the small hole, the first hole penetrating the first and second inorganic insulating films to reach a surface of the conductive layer; an eighth step of forming a pixel electrode on the second inorganic insulating film and the conductive layer exposed in the first hole; and a ninth step of forming pixel electrode in a continuous manner from the surface of conductive layer exposed in the first hole of the contact hole to outside the contact hole, the pixel electrode being formed above the second inorganic insulating layer.

According to this method, the first inorganic insulating film can be formed to substantially completely cover the surface of the conductive layer in the third step, and then the organic resin film is formed in the fourth step. Thus, the surface of the conductive film is prevented from coming into direct contact with the organic resin film.

In the fifth step, the small hole that penetrates the organic resin film is formed. Then the first hole that penetrates the first inorganic insulating film is formed at the bottom of the small hole in the seventh step.

Subsequent to the fifth step, the sixth step is performed to form the second inorganic insulating film in a continuous manner from inside the small hole to outside the small hole, and then the seventh and eighth steps are conducted continuously to form the second hole that continues from the first hole to thereby make the contact hole. Alternatively, the seventh step of forming the first hole may be performed after the fifth step, and then the sixth step may be performed to bury the first hole such that the second inorganic insulating film is formed in a continuous manner from inside the small hole to outside the small hole. Here, in the eighth step, the second inorganic insulating film is removed from the first hole, and the first hole and the second hole are formed to thereby form the contact hole.

According to the method of the fourth aspect, sidewall of the small hole in the contact hole is covered with the second inorganic insulating film. Thus, when the pixel electrode is formed in the ninth step, the second inorganic insulating film is interposed between the organic resin film and the pixel electrode and extends continuously from inside the small hole to outside the small hole. Thus, the pixel electrode is substantially prevented from contacting the organic resin film.

In the fifth step, an organic substance derived from the organic resin film may remain in the small hole. However, such a remaining substance can be removed from the contact hole in the seventh step of forming the first hole.

Thus, according to the method of this aspect described above, as with the electrooptic device previously described, the contact properties of the contact holes can be improved while film separation and cracking of the pixel electrode or the like are prevented. Thus, the yield of the production process can be improved, and high-quality image display and high reliability can be attained in the electrooptic device.

According to an embodiment of the method of the fourth aspect, the seventh step and the eighth step are conducted as a single step. In this manner, the number of steps required to form the contact hole can be reduced, and the production process of the electrooptic device can be shortened.

According to another embodiment of the method of the fourth aspect, the organic resin film is formed using a photosensitive resin material in the fourth step; and the small hole is formed by exposing and developing the organic resin film in the fifth step. In this manner, the surface of the organic resin film has a satisfactory flatness, and the small hole can be easily formed in the organic resin film.

According to yet another embodiment of the method of the fourth aspect, the method further includes, after the fourth step and before the sixth step, a step of forming a reflector film on the organic resin film such that the reflector film partly overlaps the pixel electrode. In the sixth step, the second inorganic insulating film is formed on the reflector film such that the second inorganic insulating film is disposed above the reflector film and overlaps the reflector film. In this manner, separation of the reflector film can be prevented during the formation of the pixel electrode.

Other advantages will become apparent from the description of the exemplary embodiments below.

BRIEF DESCRIPTION OF THE DRAWINGS

The invention will be described with reference to the accompanying drawings, wherein like numbers reference like elements.

FIG. 14 is a block diagram showing an overall structure of an organic EL device according to a third embodiment.

DESCRIPTION OF EXEMPLARY EMBODIMENTS

1. First Embodiment

A first embodiment of the present invention will now be described with reference to FIGS. 1 to 11. In this embodiment, the invention is applied to an active matrix transmissive liquid crystal device.

1.1 Overall Structure of Liquid Crystal Device

Figure 1:
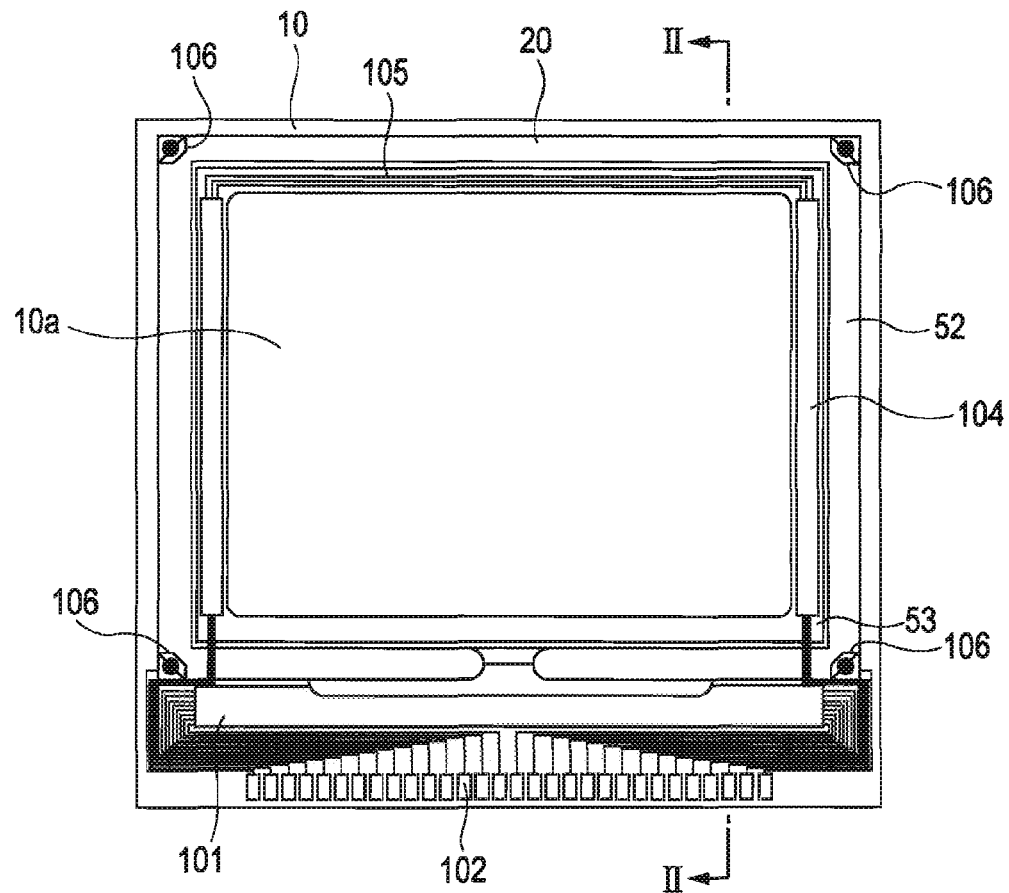
FIG. 1 is a plan view showing an overall structure of an electrooptic device.
Figure 2:
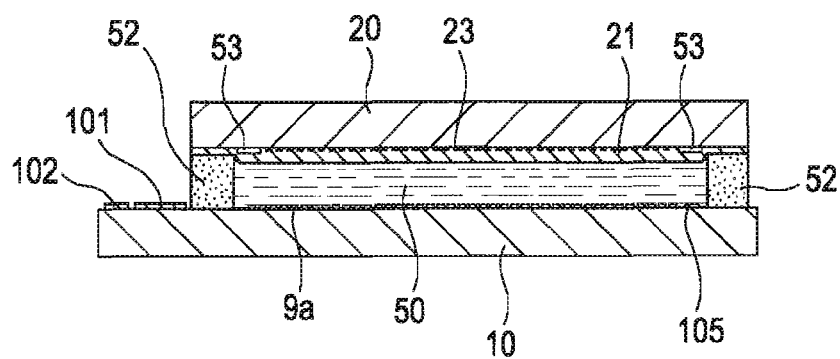
FIG. 2 is a cross-sectional view taken along line II-II in FIG. 1.

First, the overall structure of the liquid crystal device of this embodiment will be described with reference to FIGS. 1 to 3. FIG. 1 is a plan view of a liquid crystal device viewed from the counter substrate-side. FIG. 2 is a cross-sectional view taken along line II-II in FIG. 1.

As shown in FIG. 2, in this liquid crystal device, a TFT array substrate 10, which is an example of the substrate according to the present invention, and a counter substrate 20 are arranged opposite each other and a liquid crystal layer 50 is sealed between the TFT array substrate 10 and the counter substrate 20.

The TFT array substrate 10 and the counter substrate 20 are bonded to each other with a sealing member 52 disposed in a sealing region around an image display region 10a where the liquid crystal layer 50 is formed. The sealing member 52 is composed of UV-curable resin, thermosetting resin, or the like material for bonding the two substrates, and is made by applying the material on the TFT array substrate 10 and curing the applied material through UV irradiation, heating, or the like, during the manufacturing process. In order to adjust the gap between the TFT array substrate 10 and the counter substrate 20 (inter-substrate gap) to a predetermined value, gap material such as glass fibers or glass beads, are dispersed in the sealing member 52. Note that in FIGS. 1 and 2, the illustration of the gap material is omitted.

A frame light-shielding film 53 for defining the frame region of the image display region 10a is disposed at the counter substrate 20-side and in parallel to the inner side of the sealing region in which the sealing member 52 is disposed. Alternatively, part or all of the frame light-shielding film 53 may be disposed at the TFT array substrate 10-side so that it functions as an internal light-shielding film.

A data line driving circuit 101 and external circuit connecting terminals 102 are disposed along a first side of the TFT array substrate 10 in the adjacent region surrounding the image display region 10a on the TFT array substrate 10. Moreover, scan line driving circuits 104 lie along the two sides (second and third sides) adjacent to the above-described first side and are covered with the frame light-shielding film 53. In order to connect between the two scan line driving circuits 104 disposed along the two opposing sides of the image display region 10a, a plurality of leads 105 are formed along the remaining side (fourth side) of the TFT array substrate 10 and are covered with the frame light-shielding film 53. Four vertical connecting terminals 106 for ensuring electrical conduction to the counter substrate 20 are respectively disposed at the four corners of the image display region 10a on the TFT array substrate 10.

In FIG. 2, pixel electrodes 9a are formed on multilayer structures that include TFTs, i.e., pixel switching elements, and various leads. Although not shown in FIGS. 1 and 2, an alignment film is formed above the pixel electrodes 9a. A counter electrode 21 is formed on the surface of the counter substrate 20 facing the TFT array substrate 10 so that the counter electrode 21 faces the pixel electrodes 9a with the liquid crystal layer 50 therebetween. In particular, the counter electrode 21 is arranged to face the pixel electrodes 9a, and typically formed over the entire image display region 10a as one continuous layer. Alternatively, the counter electrode 21 may have a striped pattern, an island-like pattern corresponding to the pixel electrodes 9a, or a segmented pattern.

As voltage is applied to each pixel electrode 9a and the counter electrode 21, liquid-crystal hold capacitance is generated between the pixel electrode 9a and the counter electrode 21. A grid-shaped or stripe-shaped light-shielding film 23 is formed below the counter electrode 21, i.e., between the surface of the counter substrate 20 facing the TFT array substrate 10 and the counter electrodes 21 as shown in FIG. 2. An alignment film not shown in FIG. 1 or 2 covers the top of the counter electrode 21. The liquid crystal layer 50 is composed of one or more types of nematic liquid crystal and enters a predetermined alignment state between the pair of alignment films.

Although not shown in the drawings, a sampling circuit that samples video signals on the video signal lines and supplies the sampled signals to the data lines, a precharge circuit that supplies precharge signals of predetermined voltages to data lines before the video signals, an inspection circuit used for inspecting the quality, defects, and the like of the liquid crystal device during the manufacture or at the time of shipping, and other components may be formed on the TFT array substrate 10 in addition to the data line driving circuit 101 and the scan line driving circuits 104. Moreover, a polarizing film, a retardation film, a polarizing plate, and the like are disposed on the projection light-incident side of the counter substrate 20 or the output light-outgoing side of the TFT array substrate 10 and in predetermined directions depending on the operation mode such as a twisted nematic (TN) mode, a super twisted nematic (STN) mode, and a double STN (D-STN) mode and whether the device is of a normally white mode or normally black mode.

Next, the circuit structure and the operation of the electrooptic device having the above-described structure are described with reference to FIG. 3. FIG. 3 is an equivalent circuit of various elements, leads, etc., of a plurality of pixels arranged to form a matrix and constituting the image display region of the electrooptic device.

Figure 3:
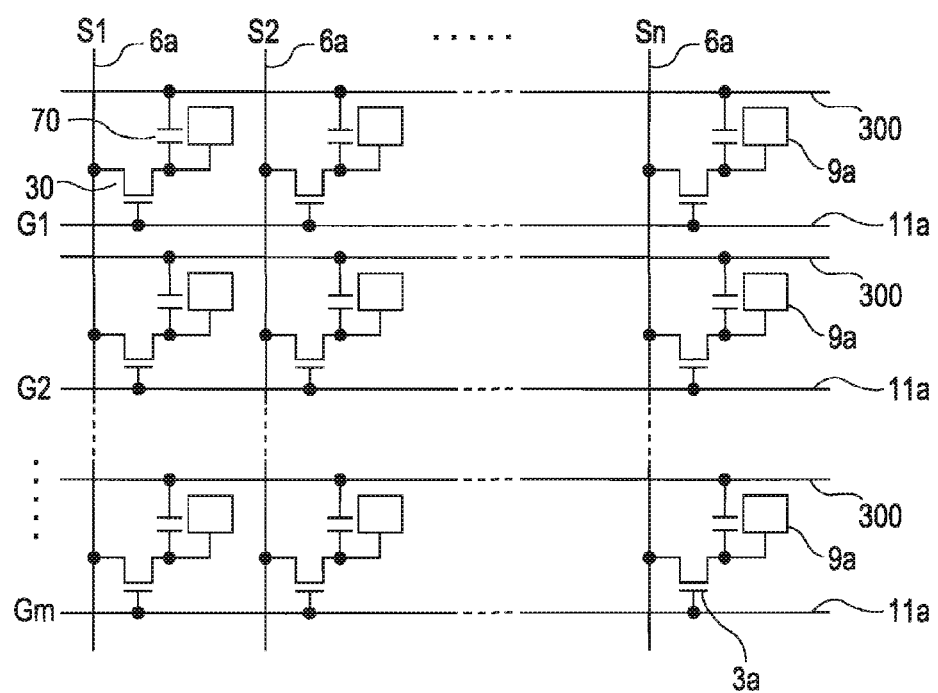
FIG. 3 is an equivalent circuit diagram of various elements, wires, etc., of pixels.

In FIG. 3, each of the pixels or pixel units formed in to a matrix and constituting the image display region 10a according to this embodiment is provided with a pixel electrode 9a and a TFT 30 for switching control of the pixel electrode 9a. A data line 6a to which image signals are supplied is electrically connected to the source of the TFT 30. The video signals S1, S2, . . . , Sn to be written on the data lines 6a may be line-sequentially supplied or may be supplied to groups of adjacent data lines 6a in a group-by-group manner. The pixel switching element may be a transistor of any other appropriate type, a thin film diode (TFD), or the like instead of the TFT.

A gate electrode 3a is electrically connected to the gate of the TFT 30 to line-sequentially supply pulsed scanning signals G1, G2, . . . , Gm in this order to a scan line 11a and the gate electrode 3a at predetermined timings. The pixel electrode 9a is electrically connected to the drain of the TFT 30 and closes the switch of the TFT 30, i.e., the pixel switching element, for a predetermined time to write image signals S1, S2, . . . , Sn supplied from the data line 6a at predetermined timings.

Video signals S1, S2, . . . , Sn of predetermined levels written on the liquid crystal through the pixel electrode 9a are held for a predetermined time between the liquid crystal and the counter electrode 2l on the counter substrate 20. Since the liquid crystal changes the alignment and order of the molecular association in response to the applied voltage levels, light modulation and display of gradation are possible. In a normally white mode, the transmittance with respect to the incident light decreases in response to the applied voltage in each pixel. In a normally black mode, the transmittance with respect to the incident light increases in response to the applied voltage in each pixel. As a whole, light having a contrast corresponding to the video signal is emitted from the electrooptic device.

In the transmissive liquid crystal display of this embodiment, light, such as projection light, entering the counter substrate 20 from the light source enters the liquid crystal through the opening of each pixel unit and modulated with the liquid crystal. The modulated light passes through the pixel electrode 9a and is emitted from the TFT array substrate 10 as display light.

In order to prevent leakage of the retained video signals, a storage capacitor 70 is additionally provided in parallel with the liquid crystal capacitance between the pixel electrode 9a and the counter electrode 21. The storage capacitor 70 is in parallel with the scan line 11a and includes a fixed potential-side capacitor electrode and a capacitor electrode 300 fixed at a constant potential.

1.2 Structure of Pixel Unit

The structure of the pixel unit of the electrooptic device of the present invention will now be described. In the description below, the structure at the TFT array substrate 10-side is explained with reference to FIGS. 4 and 5.

Figure 4:
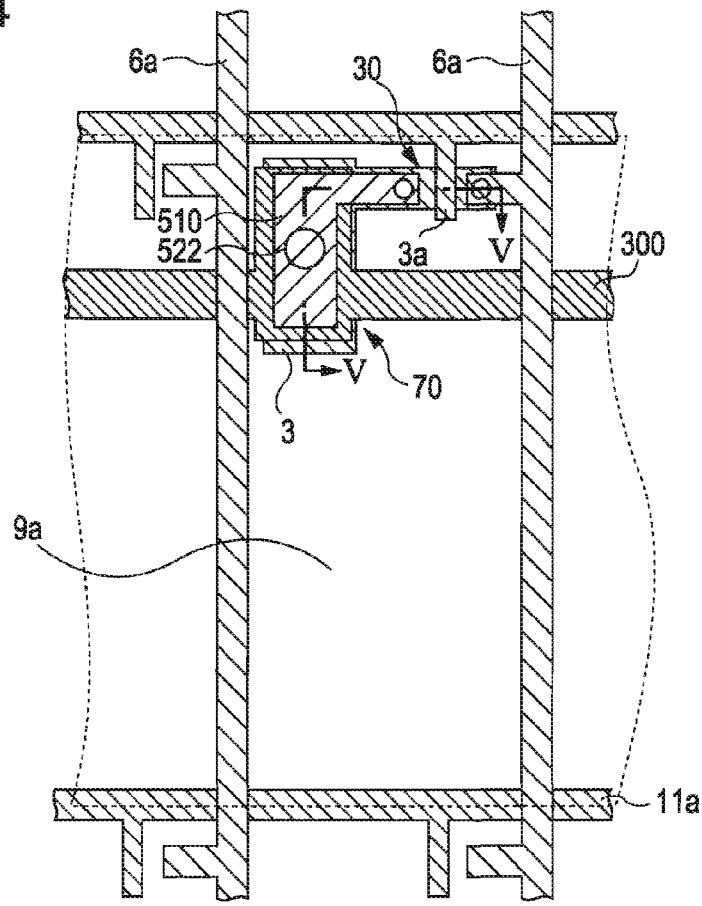
FIG. 4 is a plan view of a pixel unit of a TFT array substrate.
Figure 5:
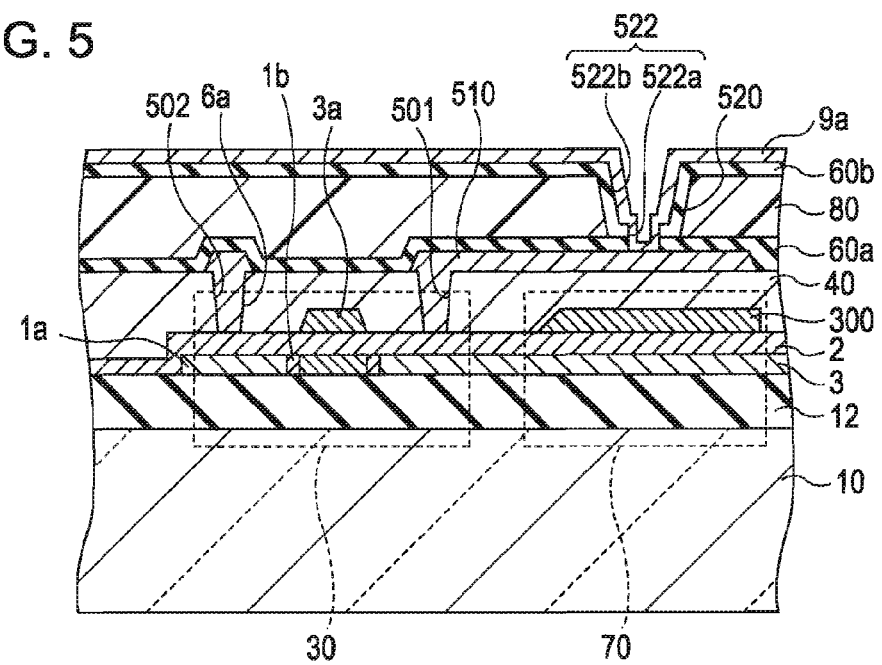
FIG. 5 is a cross-sectional view of the pixel unit shown in FIG. 4 taken along line V-V.

FIG. 4 is a plan view of an arbitrarily selected pixel unit of the TFT array substrate 10 in which data lines, scan lines, pixel electrode, and other associated components are formed. FIG. 5 is a cross-sectional view taken along line V-V in FIG. 4.

In FIG. 5, the TFT array substrate 10 is an insulating transparent substrate such as a glass substrate or a semiconductor substrate. For example, a silicon oxide film ($SiO_2$) is formed on the TFT array substrate 10 to function as a base insulating film 12. The TFT 30 and the storage capacitor 70 are formed on the base insulating film 12.

Referring to FIGS. 4 and 5, the TFT 30 includes a semiconductor film 3, e.g., a polysilicon film formed on the base insulating film 12, a gate oxide film 2, e.g., a silicon oxide film ($SiO_2$) embedding the semiconductor film 3, and the gate electrode 3a, which is disposed on the gate oxide film 2 and formed to correspond the semiconductor film 3. The gate electrode 3a is composed of a conductive material whose main components are aluminum (Al), tungsten (W), tantalum (Ta), or molybdenum (Mo), for example. The semiconductor film 3 has two lightly doped regions 1b with a low impurity concentration at opposing sides across the channel region of the TFT 30. Heavily doped regions 1a with a high impurity concentration are formed next to the lightly doped regions 1b. That is, FIG. 5 shows an example of the TFT 30 having a lightly doped drain (LDD) structure.

In FIGS. 4 and 5, the storage capacitor 70 includes a lower electrode, which is a part of the heavily doped region 1a in the semiconductor film 3, and the capacitor electrode 300, which is disposed on the gate oxide film 2 and serves as the fixed potential-side capacitor electrode. Preferably, the capacitor electrode 300 and the scan lines 11a are formed from the same conductive film as the gate electrode 3a.

Referring to FIG. 5, a first interlayer insulating film 40 composed of silicon oxide ($SiO_2$) that buries the gate electrode 3a, the scan lines 11a (not shown), and the capacitor electrode 300 is formed. Contact holes 501 and 502 that extend from the surface of the first interlayer insulating film 40 to the surface of the heavily doped region 1a in the semiconductor film 3 by penetrating the first interlayer insulating film 40 and the gate oxide film 2 are formed in the first interlayer insulating film 40. The contact holes 501 and 502 are filled with a conductive material whose main component is, for example, aluminum (Al) so that the data line 6a that electrically connects to the source of the TFT 30 is formed on the first interlayer insulating film 40 and also that a drain electrode 510 is formed on the first interlayer insulating film 4U.

In a plan view of the TFT array substrate 10 viewed from the above, a first inorganic insulating film 60a composed of, for example, silicon nitride (SiN) is formed to overlap the drain electrode 510, the data line 6a, and the TFT 30. An organic resin film 80 is formed on the first inorganic insulating film 60a by using a photosensitive organic resin material, such as acrylic resin. As shown in FIG. 5, the first inorganic insulating film 60a is, for example, formed as the base of the organic resin film 80 so that the first inorganic insulating film 60a can function as a protective film that prevents water entering the organic resin film 80 from dispersing into the TFT 30, the data line 6a, or the drain electrode 510. Moreover, formation of the first inorganic insulating film 60a can prevent water from entering the organic resin film 80 from below.

A small hole 520 penetrating the organic resin film 80 is formed in the organic resin film 80. A first hole 522a having a diameter less than or equal to the bottom of the small hole 520 and penetrating the first inorganic insulating film 60a is formed inside and at the bottom of the small hole 520. The surface of the drain electrode 510 is exposed in the first hole 522a.

A second inorganic insulating film 60b composed of, for example, silicon nitride (SiN) or silicon oxide is formed on the organic resin film 80. The second inorganic insulating film 60b is continuously formed from inside the small hole 520 to outside the small hole 520 so as to cover the sidewall of the small hole 520. Inside the small hole 520, a second hole 522b whose sidewall is formed with the second inorganic insulating film 60b is formed in a continuous manner from the first hole 522a. A contact hole 522 constituted from the first hole 522a and the second hole 522b is thereby formed.

As shown in FIGS. 4 and 5, the pixel electrode 9a that continuously extends from the surface of the drain electrode 510 exposed in the contact hole 522 to the opening region outside the contact hole 522 is formed by using, for example, a transparent conductive material, such as indium tin oxide (ITO). Since the second inorganic insulating film 60b is interposed between the pixel electrode 9a and the organic resin film 80, the pixel electrode 9a is generally prevented from coming into contact with the organic resin film 80. Preferably, the second inorganic insulating film 60b is formed from inside the small hole 520 to outside the small hole 520 in a continuous manner to thereby substantially cover the entire surface of the organic resin film 80 so that the water is prevented from entering the organic resin film 80 from above and from dispersing to above the organic resin film 80.

Since the pixel unit of this embodiment is formed as a multilayer structure in which the pixel electrode 9a, the TFT 30, the drain electrode 510, and the associated components are in layers of different levels, the aperture ratio can be increased. Moreover, since the water is prevented from entering the organic resin film 80 from above as well as below, swelling of the organic resin film 80 can be prevented. Thus, separation or cracking of the pixel electrode 9a due to the swelling of the organic resin film 80 can be prevented. Since dispersion of water from the organic resin film 80 to the liquid crystal through the pixel electrode 9a can be prevented, reliability of the electrooptic device can be improved.

1.3 Method for Making Electrooptic Device

A method for making the above-described electrooptic device will now be described with reference to FIGS. 4, to 7. FIGS. 6A to 6D and 7A to 7B are process diagrams showing the individual steps of the production process in sequence by showing the structures of the main components.

First, the process of making components below the first inorganic insulating film 60a at the TFT array substrate 10-side is described.

First, the base insulating film 12 is formed on the TFT array substrate 10 by plasma-enhanced chemical vapor deposition (CVD), and the semiconductor film 3 is then formed. The semiconductor film 3 formed on the base insulating film 12 is activated by, for example, laser and then patterned by micromachining.

The gate oxide film 2 is then formed by plasma-enhanced CVD, for example. A resist covering the surface of the channel region and the lightly doped regions 1b in the semiconductor film 3 is formed on the gate oxide film 2, and ions of an impurity, for example, phosphorus (P), are injected at an injection rate of $1\times10^{15}$ [ions/cm$^2$] to $1\times10^{16}$ [ions/cm$^2$] into the heavily doped regions 1a in the semiconductor film 3 through the gate oxide film 2 by an ion doping technique.

Subsequently, the resist is removed, and the conductive film formed by, for example, sputtering is patterned by micromachining to form the gate electrode 3a, the scan line 11a, and the capacitor electrode 300. While using the gate electrode 3a and the associated components as a mask, ions of an impurity, e.g., phosphorus (P), are injected at an injection rate of $1\times10^{13}$ [ions/cm$^2$] to $1\times10^{14}$ [ions/cm$^2$] into the semiconductor film 3 through the gate oxide film 2 by ion doping. As a result, the lightly doped regions 1b are formed in the semiconductor film 3.

Next, the first interlayer insulating film 4u is formed by plasma-enhanced CVD, patterned by micromachining, and dry-etched to form the contact holes 501 and 502. The contact holes 501 and 502 are buried by sputtering to form a conductive film, and the conductive film is subjected to micromachining to form the data line 6a and the drain electrode 510.

Referring to FIGS. 6A to 7B, the process of making the components above the data line 6a and the drain electrode 510 are described with particular attention to the structure around the contact hole 522 in FIGS. 4 and 5.

Figure 6A:
FIGS. 6A to 6D are process diagrams that show the structure of the main portion and the steps of the manufacturing process in sequence.
Figure 6B:
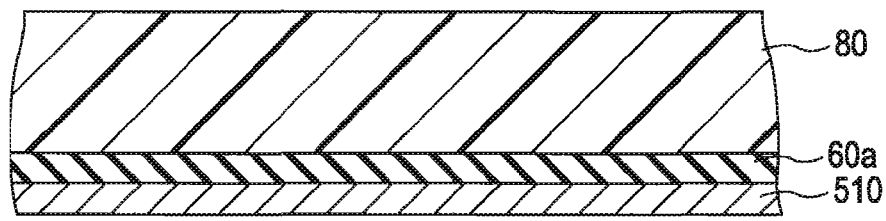

In FIG. 6A, the first inorganic insulating film 60a is formed on the data line 6a and the drain electrode 510 by, for example, plasma-enhanced CVD, and then in FIG. 65, the organic resin film 80 is formed by spin coating. In this manner, the surface of the organic resin film 80 can have satisfactory flatness. As shown in FIG. 6B, the first inorganic insulating film 60a is interposed between the drain electrode 510 and the organic resin film 80 so that the surface of the drain electrode 510 does not come into direct contact with the organic resin film 80.

Figure 6C:
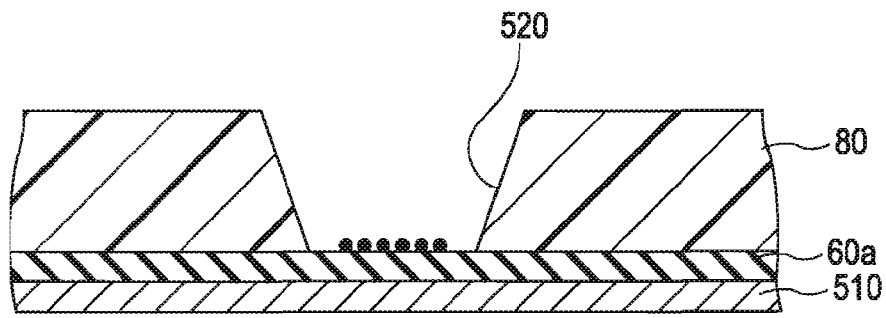

The organic resin film 80 under such a state is then subjected to exposure and development by photolithography as shown in FIG. 6C to form the small hole 520. During this step, an organic substance, such as carbon, derived from the organic resin film 80 may remain on the surface of the first inorganic insulating film 60a exposed in the bottom of the small hole 520. This substance is indicated by dots in FIG. 6C.

Figure 6D:
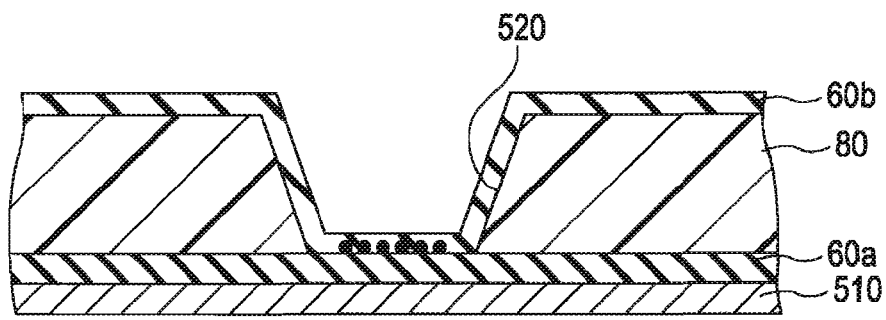

In the subsequent step shown in FIG. 6D, the second inorganic insulating film 60b is formed in a continuous manner from inside the small hole 520 to outside the small hole 520 by, for example, plasma-enhanced CVD.

Figure 7A:
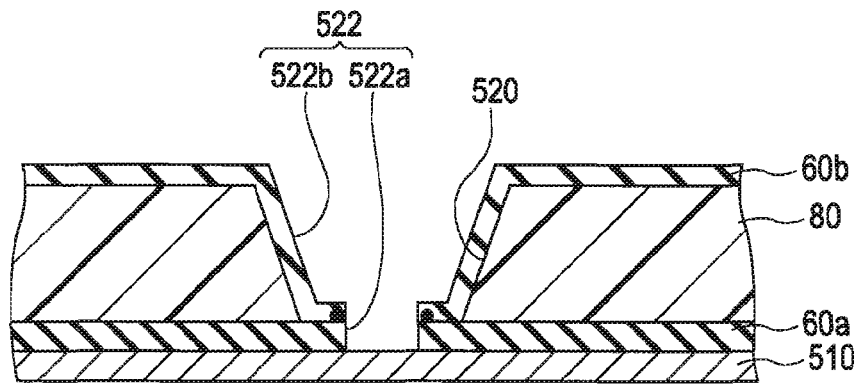
FIGS. 7A to 7B are process diagrams that show the structure of the main portion and the steps of the manufacturing process in sequence.

In FIG. 7A, the first inorganic insulating film 60a and the second inorganic insulating film 60b are, for example, dry-etched to form both the first hole 522a and the second hole 522b in the small hole 520 so as to form the contact hole 522. In the course of forming the first hole 522a and the second hole 522b, especially during forming of the first hole 522a, the substance that remained in the contact hole 522 due to the formation of the small hole 520 is removed from the contact hole 522. Moreover, since both the first hole 522a and the second hole 522b are formed in one step, the number of steps required to form the contact hole 522 can be reduced, and the production process of the liquid crystal device can be shortened.

Figure 7B:
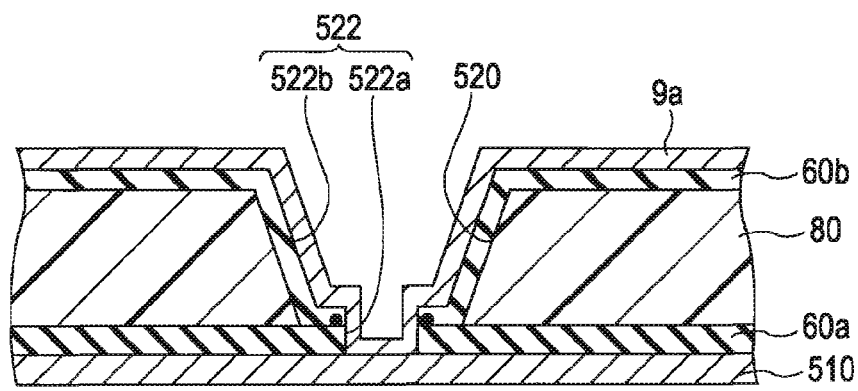

In step shown in FIG. 7B, a transparent conductive film is continuously formed from inside the contact hole 522 to outside the contact hole 522 by, for example, sputtering, and patterned by wet etching to form the pixel electrode 9a.

Note that in this embodiment, the contact hole 522 may be formed as follows instead. After forming the small hole 520, the first hole 522a is formed. The first hole 522a is buried, and the second inorganic insulating film 60b is formed in a continuous manner from inside the small hole 520 to outside the small hole 520. The second inorganic insulating film 60b is removed from the first hole 522a, and the second hole 522b is then formed.

Figure 8:
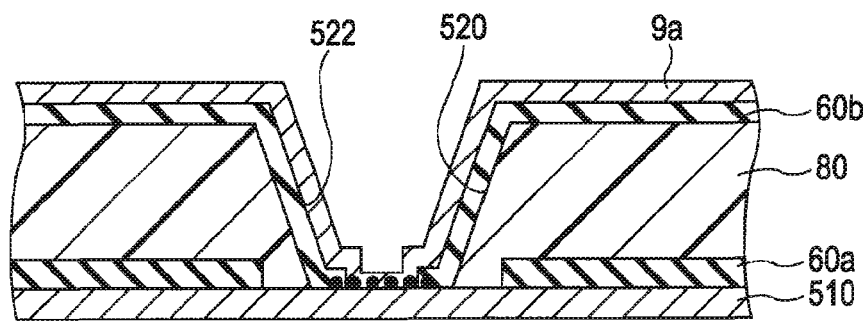
FIG. 8 shows a structure of the main portion of a comparative example.

Next, a comparative example of the production process described herein with reference to FIGS. 6A to 7B is described with reference to FIGS. 8 to 10B. FIG. 8 shows a structure of the main portion of the comparative example. FIGS. 9A to 10B are process diagrams showing the steps of the production process of the structure shown in FIG. 8 in sequence.

First, the difference between the comparative example, the main portion of which is shown in FIG. 8, and the above-described embodiment described above with reference to FIGS. 6A to 7B is described in detail. As shown FIG. 8, the first inorganic insulating film 60a is patterned corresponding to the position of the small hole 520 such that the exposed surface of the drain electrode 510 extends from inside the small hole 520 to outside the small hole 520. The surface of the drain electrode 510 exposed in the first inorganic insulating film 60a is in contact with the organic resin film 80, and the small hole 520 is formed in the organic resin film 80 in a portion making contact with the drain electrode 510. The second inorganic insulating film 60b is continuously formed from inside the small hole 520 to outside the small hole 520 such that the second inorganic insulating film 60b covers the sidewall of the small hole 520. As a result, the contact hole 522 having sidewall formed by the second inorganic insulating film 60b is formed inside the small hole 520. The pixel electrode 9a is formed to continuously cover the surface of the drain electrode 510 exposed in the contact hole 522 as well as the region outside the contact hole 522.

According to the structure shown in FIG. 8, an organic substance (indicated by dots in FIG. 8) remains on the surface of the drain electrode 510 inside the contact hole 522 because of the production process described below.

Next, the process of making the structure shown in FIG. 8 is described. Only the difference between the comparative examples and the embodiment described above is described with reference to FIGS. 9A to 11B.

Figure 9A:
FIGS. 9A to 9D are process diagrams that show the steps of the manufacturing the structure shown in FIG. 8 in sequence.
Figure 9B:

First, in FIG. 9A, the first inorganic insulating film 60a is formed. In FIG. 9B, the first inorganic insulating film 60a is patterned by, for example, dry etching to expose the surface of the drain electrode 510 at the position corresponding to the small hole 520. During this step, the incidence of surface roughening due to etching of the first inorganic insulating film 60a is high.

Figure 9C:
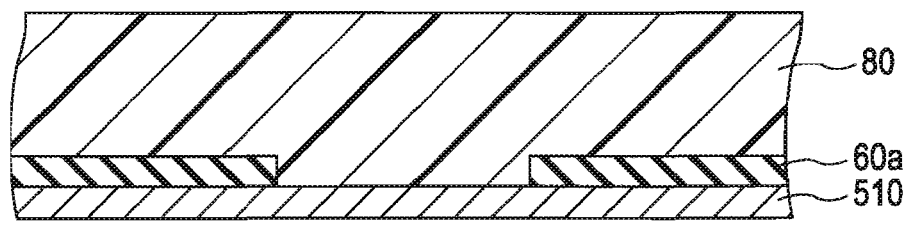

Subsequently, in FIG. 9C, the organic resin film 80 is formed, during which the surface of the drain electrode 510 exposed in the first inorganic insulating film 60a comes into contact with the organic resin film 80.

Figure 9D:
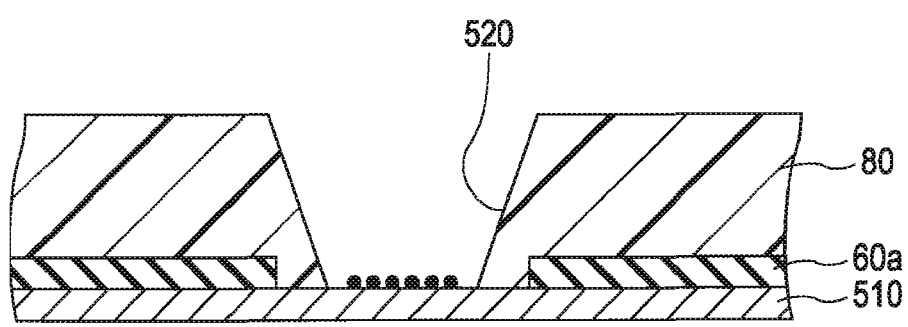

In FIG. 9D, the small hole 520 is formed in the organic resin film 80 so that the surface of the drain electrode 510 is exposed in the small hole 520. An organic substance (depicted by dots in FIG. 9D) of the organic resin film 80 may remain on the roughened surface of the drain electrode 510 in the small hole 520.

Figure 10A:
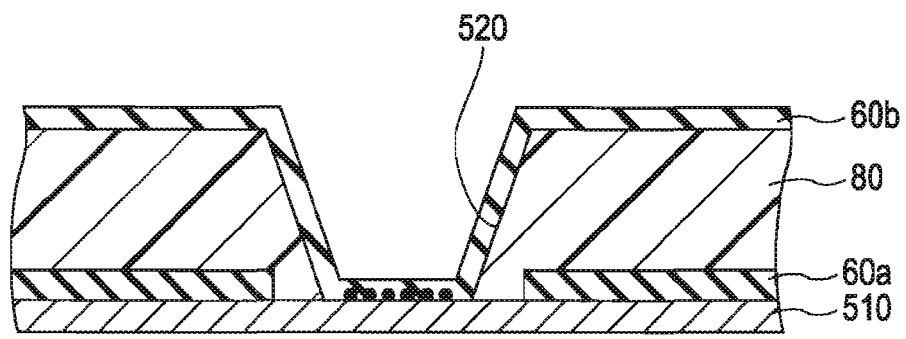
FIGS. 10A and 10B are process diagrams that show the steps of the manufacturing the structure shown in FIG. 8 in sequence.
Figure 10B:
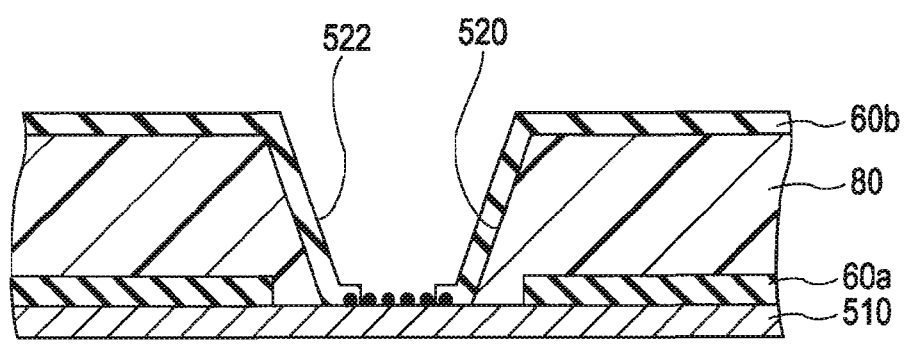

In FIG. 10A, the second inorganic insulating film 60b is formed on the organic resin film 80 in a continuous manner from inside the small hole 520 to outside the small hole 520. Then, in FIG. 10B, the second inorganic insulating film 60b is dry-etched to form the contact hole 522 inside the small hole 520. The surface of the drain electrode 510 on which the organic substance remains is exposed in the contact hole 522. The pixel electrode 9a is then formed in a continuous manner from inside the contact hole 522 to outside the contact hole 522.

Figure 11:
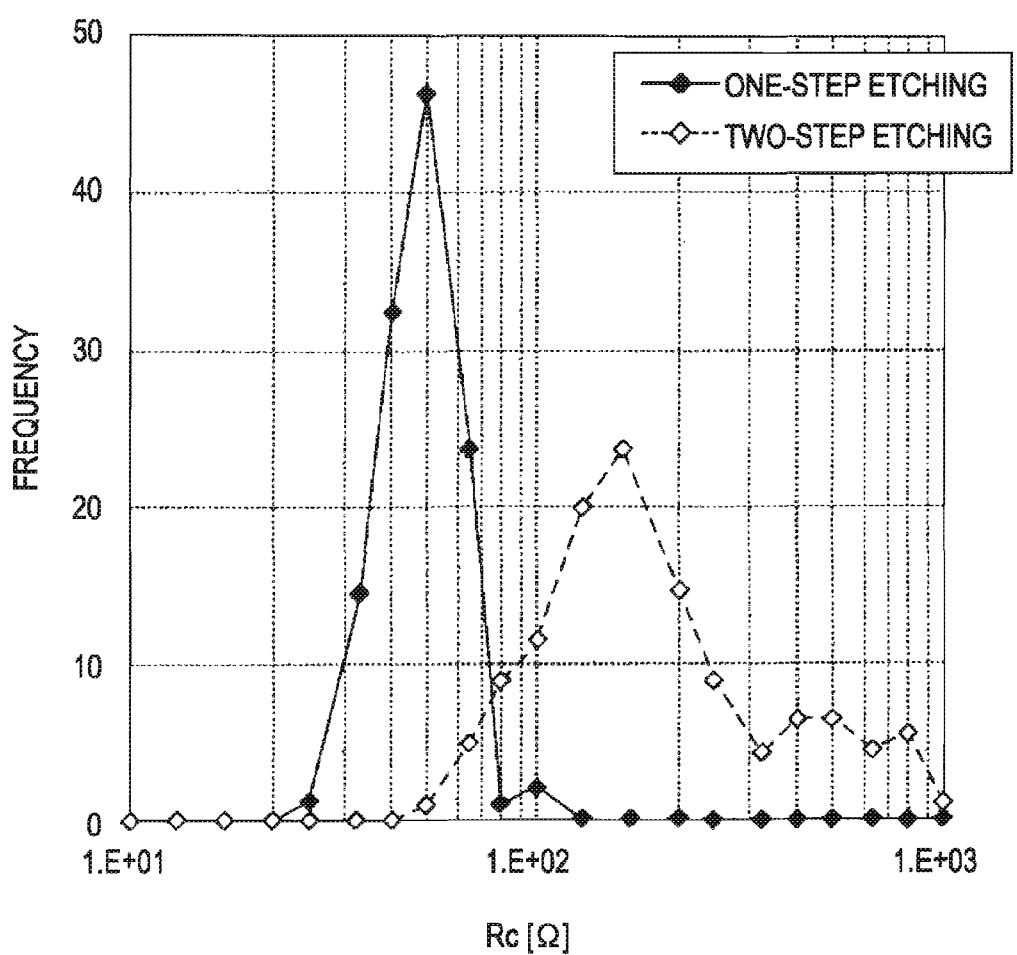
FIG. 11 is a graph showing the results of measurement of contact resistance.

FIG. 11 is a graph showing the results of the measurement of contact resistance related to the electrical connection between the pixel electrode and the drain electrode according to the embodiment and the comparative example. The graph of FIG. 11 shows the distribution of the values of contact resistance of 120 contact holes 522 of a liquid crystal device, in which the abscissa axis indicates contact resistance Rc [Ω] and the ordinate axis indicates the number of contact holes 522 for predetermined values of contact resistance. In FIG. 11, the plot indicated by a solid line and related to the example of the embodiment is labeled as "one-step etching" and the plot indicated by a broken line and related to the comparative example is labeled as "two-step etching".

As is apparent from the plot related to the comparative example, the value of the contact resistance of the contact hole 522 is relatively large and so is the variation. This is due to the organic substance remaining in the contact hole 522.

In contrast, as is previously explained, in this embodiment, no organic substance remains in the contact hole 522. Thus, the plot related to the embodiment shows that the contact resistance at the contact hole 522 can be decreased and made substantially uniform. Thus, the contact properties of the contact hole 522 can be improved. The average of the contact resistance is about 200Ω according to the comparative example, but this can be decreased by about 50Ω according to this embodiment.

As shown in FIG. 8, in the comparative example, the surface of the drain electrode 510 exposed in the first inorganic insulating film 60a partially makes direct contact with the organic resin film 80. Thus, water may diffuse from the organic resin film 80 through this portion or water may enter through this portion. As a result, the organic resin film 80 may swell, thereby causing film separation and cracks in the second inorganic insulating film 60b and the pixel electrode 9a above.

Thus, according to the liquid crystal device of this embodiment described above, film separation of pixel electrode 9a or the like can be prevented, the yield of the production process can be improved, and high-quality image display and high reliability can be attained.

2. Second Embodiment

A second embodiment of the electrooptic device will now be described with reference to FIGS. 12 and 13. The second embodiment differs from the first embodiment in that it has a reflector film. Thus, only the differences from the first embodiment are described with reference to FIGS. 12 and 13. For alike components, some may be described with reference to FIGS. 1 to 7B while descriptions for others are omitted to avoid redundancy. In the description below, the electrooptic device is applied to a reflective liquid crystal device.

Figure 12:
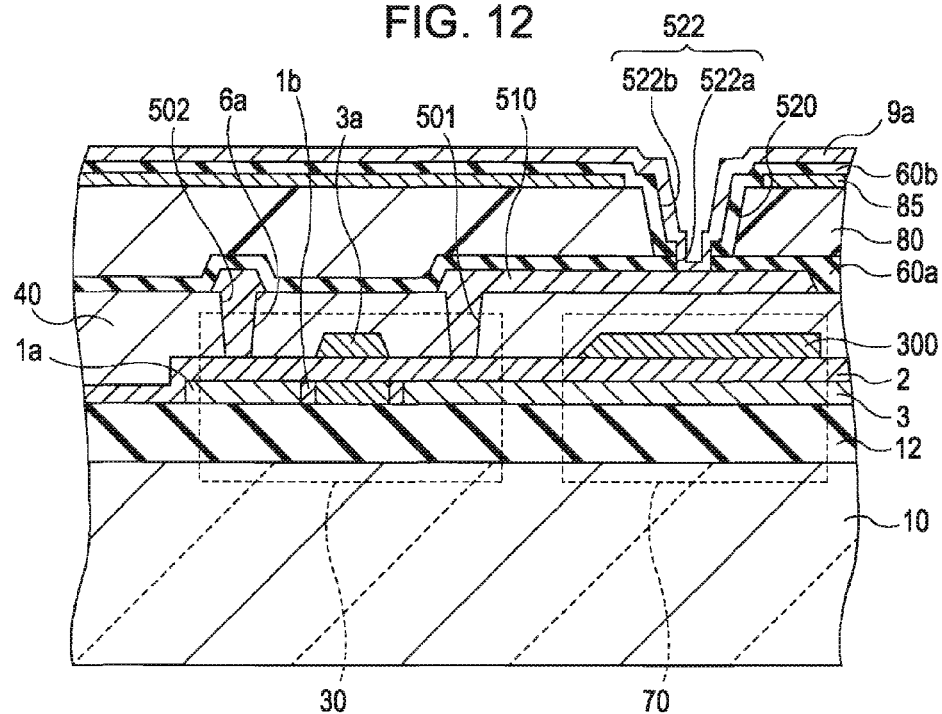
FIG. 12 is a cross-sectional view of a pixel unit of a second embodiment, the cross-sectional view showing the structure of a cross-section equivalent to that shown in FIG. 5.

FIG. 12 is a cross-sectional view equivalent to the cross-sectional view of FIG. 5, showing an arbitrarily selected pixel unit.

Referring to FIG. 12, a reflector film 85 composed of silver or an aluminum (Al)-containing material is formed on the organic resin film 80 and outside the small hole 520. When each pixel unit is viewed in a plan view from above the TFT array substrate 10, the reflector film 85 of each pixel unit partly overlaps the pixel electrode 9a. That is, the reflector film 85 is disposed such that it overlaps the pixel electrode 9a at the portion inside the opening region of the pixel. Moreover, the second inorganic insulating film 60b is formed on the reflector film 85 so as to substantially completely cover the surface of the reflector film 85. The second inorganic insulating film 60b at least contains a nitrogen atom and is preferably a silicon nitride film having a nitrogen concentration of 5 at %. In this manner, the stress applied to the reflector film 85 from the second inorganic insulating film 60b can be decreased.

Accordingly, in the second embodiment, when the electrooptic device displays images, the light modulated by the liquid crystal in each pixel unit passes through the pixel electrode 9a, reaches the reflector film 85, is reflected at the reflector film 85, and is emitted from the counter substrate 20 as the display light.

Figure 13A:
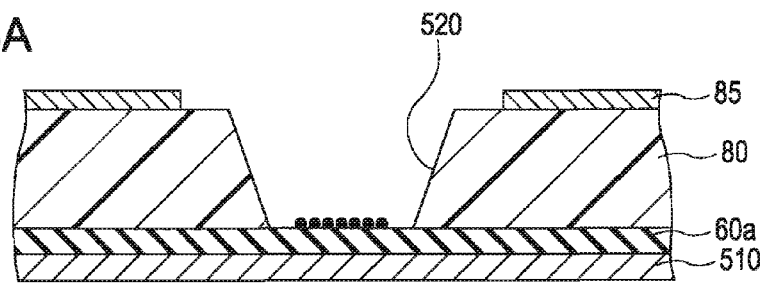
FIGS. 13A and 13B are process diagrams that show the structure of the main portion and the steps of manufacturing the structure according to the second embodiment in sequence.
Figure 13B:
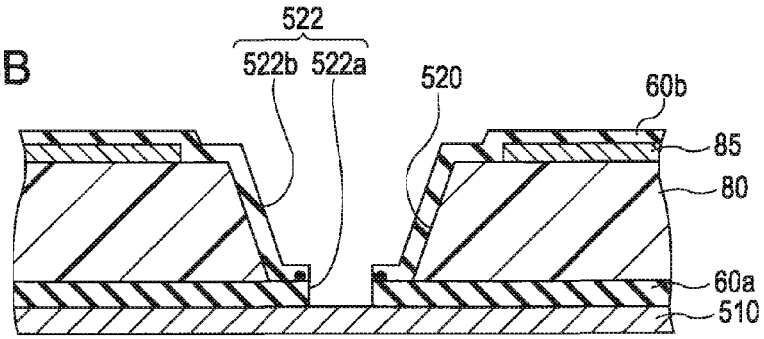

Next, the method of making the electrooptic device according to the second embodiment is described with reference to FIGS. 13A and 13B. FIGS. 13A and 13B are process diagrams illustrating in sequence the process of making the main structure of the second embodiment among the cross-sectional structure shown in FIG. 12.

In the description below of the method of making the electrooptic device, only the difference from the first embodiment are described in detail with reference to FIGS. 13A and 13B.

In FIG. 13A, the TFT 30, the data line 6a, the drain electrode 510, the scan line 11a, the storage capacitor 70, and associated components are formed on the TFT array substrate 10. Then the first inorganic insulating film 60a and the organic resin film 80 are formed over these components. The drain electrode 510 is where the pixel electrode 9a described below connects to, and the portion to be connected to the pixel electrode 9a is composed of a selected material that makes ohmic contact with the pixel electrode 9a. For example, if the pixel electrode 9a is composed of ITO, then the portion of the drain electrode 510 to be connected to the pixel electrode 9a is preferably composed of a Ti-containing metal or a metal compound containing Ti. As in FIG. 6C, the small hole 520 is formed in the organic resin film 80. Next, the material for forming the reflector film 85 is formed over the organic resin film 80 and the first inorganic insulating film 60a exposed in the small hole 520 and patterned as shown in FIGS. 12 and 13A, thereby making the reflector film 85 over the entire region except the small hole 520. The material that constitutes the reflector film 85 is, as previously mentioned, silver, an aluminum-containing material, or the like to secure the reflective property.

Subsequently, in FIG. 13B, the second inorganic insulating film 60b is formed over the organic resin film 80, the first inorganic insulating film 60a exposed in the small hole 520, and the reflector film 85. The first inorganic insulating film 60a and the second inorganic insulating film 60b are partly removed to expose part of the drain electrode 510 so that the contact hole 522 is formed. while the surface of the reflector film 85 is covered with the second inorganic insulating film 60b, the pixel electrode 9a is formed. At this stage, the reflector film 85 is prevented from separation attributable to the pinholes, deposited dust, or the like on the surface of the reflector film 85.

According to the above-described process, not only the remaining substance derived from the organic resin film 80 but also remaining substance, such as photoresist, derived from patterning of the reflector film 85 can be prevented from adhering onto the drain electrode 510.

In the above-described step, after the reflector film 85 is formed, the first inorganic insulating film 60a and the second inorganic insulating film 60b are partly removed to expose part of the drain electrode 510 and to form the contact hole 522. Then the pixel electrode 9a is formed such that the pixel electrode 9a is connected to the drain electrode 510. In this manner, the electrical connection between the pixel electrode 9a and the drain electrode 510 can be improved.

As is described above, the material that constitutes the drain electrode 510 is selected such that the drain electrode 510 makes ohmic contact with the pixel electrode 9a. The material of the reflector film 85 is selected according to the function of reflecting light. In the above-described step, if the first inorganic insulating film 60a or the second inorganic insulating film 60b is patterned to expose the drain electrode 510 and then the reflector film 85 is formed, the material that constitutes the reflector film 85 adheres onto the surface of the drain electrode 510 exposed, and the ohmic contact between the drain electrode 510 and the pixel electrode 9a may be inhibited. However, by employing the above-described step, this problem can be avoided.

Thus, according to the second embodiment, the yield of the production of the electrooptic device can be reliably increased. Moreover, by employing the above-described step, the material for the drain electrode 510 or the pixel electrode 9a can be selected independent from the material of the reflector film 85. Thus, the material that has an excellent reflecting property can be used in the reflector film 85, and the optical properties of the electrooptic device can be improved.

3. Third Embodiment

A third embodiment of the electrooptic device will now be described with reference to FIGS. 14 to 17. The electrooptic device of the third embodiment is an organic EL device of an active matrix type. In the description below, the structures common to the first and second embodiments are referred to as the same reference numerals in FIGS. 1 to 13B and described with reference to these drawings. However, some descriptions are omitted to avoid redundancy.

3.1 Overall Structure of Organic EL Device

The overall structure of the organic EL device will first be described with reference to FIG. 14. FIG. 14 is a block diagram showing the overall structure of the organic EL device of the third embodiment.

In the image display region 110 of the organic EL device, the data lines 114 and the scan lines 112 running across each other are provided. Pixel units 700 correspond to the intersections of these lines and are arranged in a matrix. In the image display region 110, power feed lines 117 for data lines 114 are provided to correspond to the pixel units 700. Note that in this embodiment, the image display region 110 has three types of pixel units 700 for red (R), green (G), and blue (B), respectively, three types of data lines 114 that respectively corresponds to the three types of the pixel units 700, and three types of power feed lines 117 that respectively corresponds to the three types of the pixel units 700.

Scan line driving circuits 130 and a data line driving circuit 150 are formed in the adjacent region that surrounds the image display region 110. The scan line driving circuits 130 supply, in sequence, scanning signals to the scan lines 112. The scan line driving circuit 150 supplies three types of video signals, i.e., R, G, and B video signals, to the three types of data lines 114 in the image display region 110, respectively. Note that the operation of the two scan line driving circuits 130 is synchronized with the operation of the scan line driving circuit 150 through a synchronizing signal 160 supplied from an external circuit. Power for driving pixels is supplied to the power feed lines 117 from an external circuit.

Each pixel unit 700 in FIG. 14 includes an organic EL element 72, a switching transistor 76, e.g., a TFT and a hold capacitor 78.

The gate electrode of the switching transistor 76 is electrically connected to the scan line 112, and the source electrode of the switching transistor 76 is electrically connected to the data line 114. The drain electrode of the switching transistor 76 is electrically connected to the gate electrode of the driving transistor 74. The source electrode of the driving transistor 74 is electrically connected to the power feed line 117, and the drain electrode of the driving transistor 74 is electrically connected to the anode of the organic EL element 72.

Note that instead of the pixel circuit structure shown in FIG. 14, other types of pixel circuits such as a current-program circuit, a voltage-program circuit, a voltage-comparing circuit, and a subframe circuit, may be used.

3.2 Structure of Pixel Unit

Figure 15:
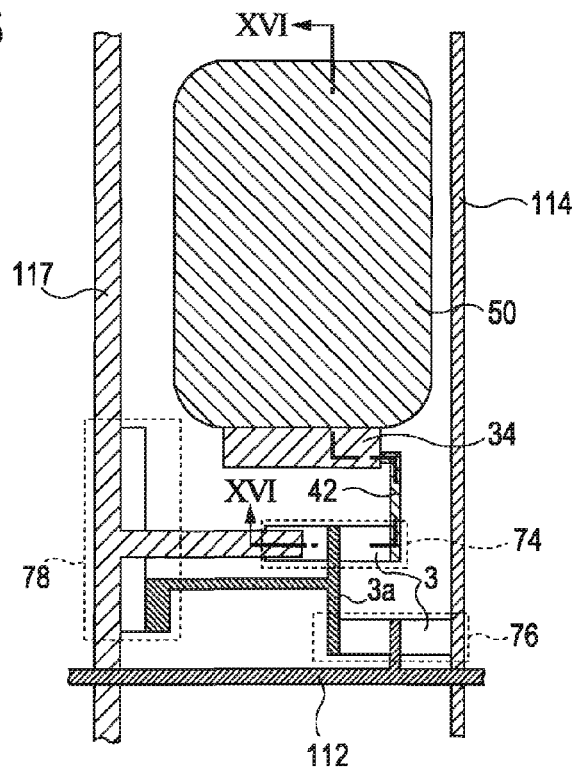
FIG. 15 is a plan view of a pixel unit according to the third embodiment.
Figure 16:
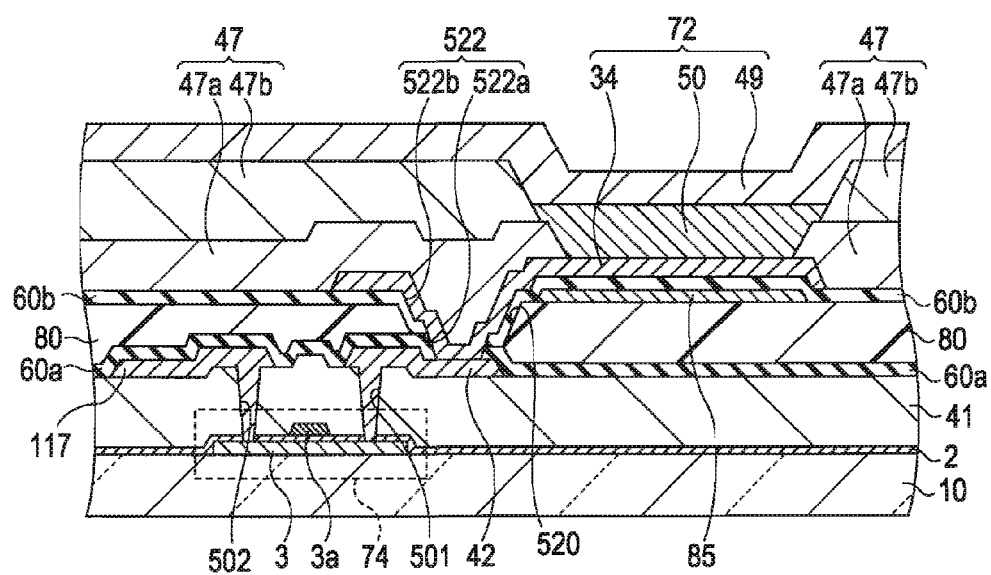
FIG. 16 is a cross-sectional view of the pixel unit shown in FIG. 15 taken along line XIV-XIV.

The detailed structure of the pixel unit 700 will now be described with reference to FIGS. 15 and 16. FIG. 15 is a plan view of an arbitrarily selected pixel unit 700 and FIG. 16 is a cross-sectional view of the pixel unit 700 taken along line XVI-XVI in FIG. 15.

The semiconductor films 3 of the switching transistor 76 and the driving transistor 74 are formed on the TFT array substrate 10 made of, for example, a transparent material such as transparent resin or glass. The semiconductor films 3 are formed by, for example, a low-temperature polysilicon technique. The gate insulating film 2 of the switching transistor 76 and the driving transistor 74 are formed over the semiconductor film 3 so as to bury the semiconductor films 3. The gate electrode 3a and the scan line 112 of the driving transistor 74 are formed on the gate insulating film 2. Part of the scan line 112 is formed as the gate electrode of the switching transistor 76. The gate electrode 3a and the scan line 112 are composed of a metal material containing at least one of aluminum (Al) tungsten (W), tantalum (Ta), molybdenum (Mo), titanium (Ti) and copper (Cu).

An interlayer insulating layer 41 is formed on the gate insulating film 2 so as to bury the scan line 112 and the gate electrode 3a of the driving transistor 74. The interlayer insulating layer 41 and the gate insulating film 2 are, for example, made from silicon oxide film.

The data line 114, the power feed line 117, and a drain electrode 42 of the driving transistor 74, each composed of a conductive material that contains, for example, aluminum or ITO, are formed on the interlayer insulating layer 41.

The contact holes 501 and 502 that extend from the surface of the interlayer insulating layer 41 to reach the semiconductor film 3 of the driving transistor 74 by penetrating the interlayer insulating layer 41 and the gate insulating film 2 are formed in the interlayer insulating layer 41. As shown in FIG. 16, the conductive films that constitute the power feed line 117 and the drain electrode 42 are continuously formed along the inner walls of the contact holes 501 and 502, respectively, to the surface of the semiconductor film 3.

Here, the lower capacitor electrode of the hold capacitor 78 is formed in the same layer as the scan line 112 and is composed of the same material, for example. Part of the power feed line 117 is formed to serve as an upper capacitor electrode of the hold capacitor 78. the interlayer insulating layer 41 is formed to function as a dielectric film, and part of the interlayer insulating layer 41 is interposed between the lower and upper capacitor electrodes.

The first inorganic insulating film 60a is formed on the interlayer insulating layer 41 by burying the power feed line 117 and the drain electrode 42. The organic resin film 80 is formed on the first inorganic insulating film 60a. The small hole 520 that penetrates the organic resin film 80 is formed in the organic resin film 80. Inside the small hole 520, the first hole 522a that extends from the bottom of the small hole 520 and penetrates the first inorganic insulating film 60a is formed.

The reflector film 85 is formed on the organic resin film 80 in the opening region outside the small hole 520 such that, when viewed from above the TFT array substrate 10, the reflector film 85 overlaps an anode 34. The second inorganic insulating film 60b is formed on the organic resin film 80 so as to substantially entirely cover the surface of the reflector film 85. Inside the small hole 520, the second hole 522b having sidewall constituted from the second inorganic insulating film 60b is formed in a continuous manner from the first hole 522a. The contact hole 522 is formed thereby.

As shown in FIG. 16, the anode 34 is formed continuously from the surface of the drain electrode 42 exposed in the contact hole 522 to the opening region outside the contact hole 522. The drain electrode 42 is, for example, composed of a transparent conductive material such as ITO. The materials for the reflector film 85 and the drain electrode 42 are selected in the same manner as in the second embodiment. In this embodiment, a material that can inject holes into the organic EL layer 50 is selected as the material of the anode 34 (pixel electrode) so that the anode 34 can properly function as the anode of the organic EL element 72.

A first barrier layer 47a composed of silicon oxide is formed on the second inorganic insulating film 60b, and a second barrier layer 47b is formed on the first barrier layer 47a. The first barrier layer 47a and the second barrier layer 47b constitutes a barrier 47, which defines the opening region, which is the region in which the organic EL layer 50 is to be formed in the pixel unit 700. Here, the first barrier layer 47a and the second inorganic insulating film 60b should contain at least a nitrogen atom and are preferably silicon oxide films with a nitrogen concentration of 5 at % or less. In this manner, the stress applied to the anode 34 from the first barrier layer 47a can be decreased.

In the opening region, the organic EL layer is formed on the surface of the anode 34 exposed from the barrier 47. Although the detailed structures of the organic EL layer 50 are not illustrated in the drawing, the organic EL layer 50 includes, for example, an emission layer, or a hole injection layer or hole transport layer in addition to the emission layer.

A cathode 49 is formed in each pixel unit 700 such that the organic EL layer 50 is interposed between the cathode 49 and the anode 34. The cathode 49 is composed of, for example, ITO. In particular, the cathode 49 is arranged opposite the anode 34, typically on the TFT array substrate 10, and is formed as one solid layer substantially covering the image display region 110 above the organic EL layer 50. The cathode 49 may be stripe-patterned, island-patterned, or segment-patterned. When the cathode 49 is composed of ITO, it is preferable to form an electron injection layer for injecting electrons to the organic EL layer 50 between the organic EL layer 50 and the cathode 49. The electron injection layer is preferably composed of an alloy containing an alkali metal or an alkaline earth metal such as MgAg, or an oxide or fluoride containing an alkali metal or an alkaline earth metal such as LiF.

The organic EL element 72 includes the anode 34, the cathode 49, and the organic EL layer 50 interposed between the anode 34 and the cathode 49. In FIG. 16, a second substrate arranged to oppose the TFT array substrate 10 and functioning as a sealing substrate is omitted from the drawing.

As in the above-described structure, the reflector film 85 is formed between the organic resin film 80 and the second inorganic insulating film 60b. Thus, separation of the reflector film 85 from the organic resin film 80 can be prevented. Moreover, the anode 34, in particular, the part where the anode 34 is connected to the drain electrode 42, i.e., the part of the anode 34 inside the contact hole 522, is disposed between the second inorganic insulating film 60b composed of an inorganic material and barrier 47 also composed of an inorganic material. Thus, breaking of the anode 34 can be prevented.

During driving of the organic EL device, a scan signal is supplied through the scan line 112 to switch on the switching transistor 76. As the switching transistor 76 is switched on, the video signal from the data line 114 is written into the hold capacitor 78. The state of electrical conduction of the driving transistor 74 is determined in response to the current of the video signal written onto the hold capacitor 78. Then as the current corresponding to the video signal written onto the hold capacitor 78 is supplied to the anode 34 of the organic EL element 72 through the channel of the driving transistor 74, the organic EL layer 50 emits light according to the current supplied.

In this embodiment, the light emitted from the organic EL layer 50 passes through the anode 34 and is reflected at the reflector film 85 so that the reflected light is emitted from the second substrate as the display light from the organic EL element 72. In this embodiment, the organic EL device is of a top-emission type.

Note that in the third embodiment, the organic EL device may be formed as a top emission type by forming the anode 34 with a metal material without the reflector film 85. Alternatively, the cathode 49 may be formed with a metal material and the light emitted from the organic EL element 72 may be emitted from the TFT array substrate 10 as the display light so that the organic EL device is formed as a bottom-emission type.

Figure 17:
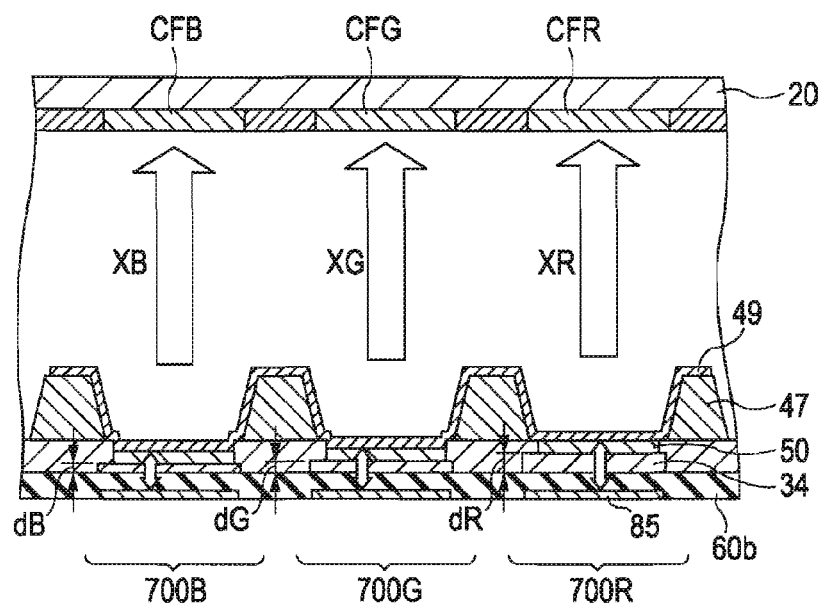
FIG. 17 is a cross-sectional view of a portion of the pixel unit above a reflector film.

In the third embodiment, the pixel unit 700 has a micro cavity structure, which is described below in detail with reference to FIG. 17. FIG. 17 is a cross-sectional view of a portion above the reflector film 85 for each of the three types of the pixel units 700, i.e., R, G, and B pixel units. FIG. 17 shows the three types of pixel units 700, i.e., a pixel unit 700R for red, a pixel unit 700G for green, and a pixel unit 700B for blue. Only the portion above the reflector film 85 among the structure described with reference to FIGS. 15 and 16 is schematically shown. The structure of the counter substrate is also schematically shown.

In the micro cavity structure, the organic EL layer 50 in each of the pixel units 700R, 700G, and 700B is composed of, for example, a material that can emit light corresponding to white. The thickness dR of the anode 34 in the pixel unit 700R, the thickness dG of the anode 34 in the pixel unit 700G, and the thickness dB of the anode 34 in the pixel unit 700B are set to be different from one another. In the organic EL element 72, the thickness of the cathode 49 and the thickness of the organic EL layer 50 are set to be substantially the same among the pixel units 700R, 700G, and 700B.

As shown by double-headed open arrows in FIG. 17, the optical path length of the light emitted from the organic EL layer 50 is made to be different among the pixel units 700R, 700G, and 700B. By changing the optical path length to utilize the interference effect, the intensity of the light having wavelength corresponding to the target color can be increased in each of the pixel units 700R, 700G, and 700B. As shown in FIG. 17, the light in which a component of a particular wavelength is intensified is emitted toward the counter substrate 20 as shown by arrows XR, XG, and XB.

Three types of color layers CFR, CFG, and CFB for red, green, and blue, respectively, are formed in the openings in the surface of the counter substrate 20 that faces the TFT array substrate 10. The light emitted from the TFT array substrate 10 passes through the color layers of the corresponding colors and is emitted as the display light.

Thus, in the organic EL device that includes pixel units 700 each having a micro cavity structure, separation of the anode 34 or the reflector film 85 can be prevented, the yield of the manufacturing process can be increased, and high-quality image display and high reliability can be attained as in the first and second embodiments.

4. Electronic Apparatus

Exemplary electronic apparatuses to which the electrooptic devices of the first to third embodiments are applied will now be described.

4.1 Mobile Computer

Figure 18:
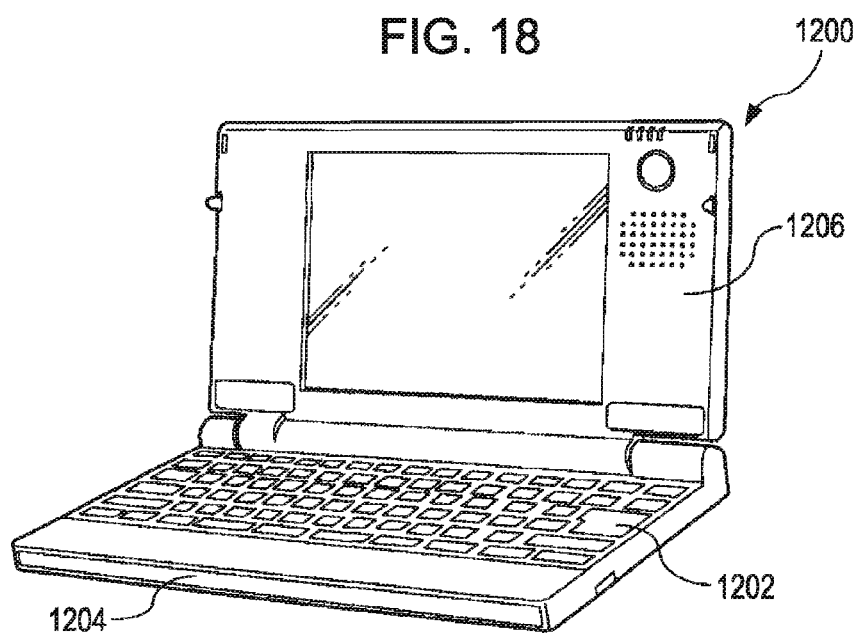
FIG. 18 is an oblique perspective illustration of a personal computer, which is an exemplary electronic apparatus to which the electrooptic device is applied.

First, an example of application of the organic EL device to a mobile personal computer is described. FIG. 18 is an oblique perspective illustration of a personal computer. In the drawing, a computer 1200 has a main unit 1204 equipped with a keyboard 1202, and a display unit 1206 to which the electrooptic device is applied.

4.2 Cellular Phone

Figure 19:
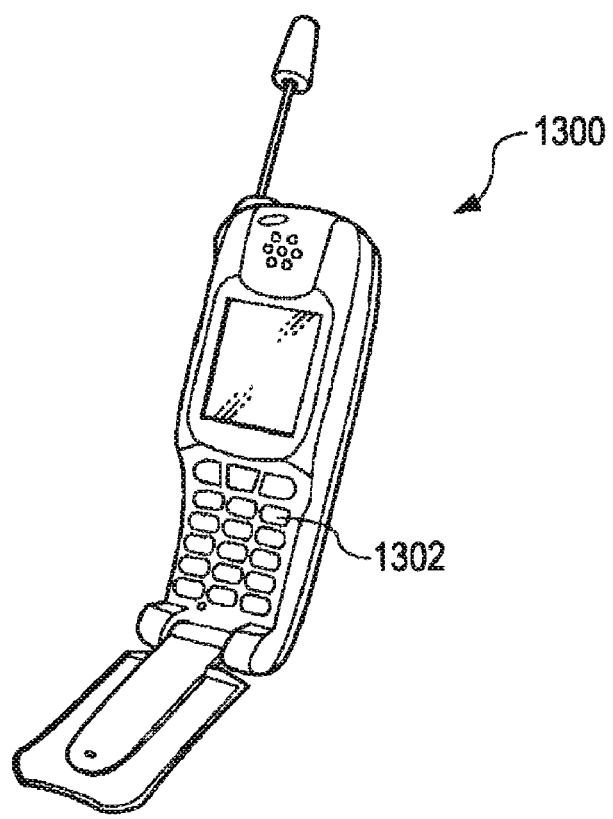
FIG. 19 is an oblique perspective illustration showing the structure of a cellular phone, which is an exemplary electronic apparatus to which the electrooptic device is applied.

Next, an example of application of the organic EL device to a cellular phone is described. FIG. 19 is an oblique perspective illustration showing the structure of a cellular phone. In the drawing, a cellular phone 1300 has a plurality of operation button 1302 and an electrooptic device.

In addition, the electrooptic device may be applied to notebook-type personal computers, PDAs, televisions, viewfinder-type or monitor direct-view-type videotape recorders, car navigation systems, pagers, electronic books, calculators, word processors, work stations, POS terminals, and touch panels. Moreover, the electrooptic device may be used as an exposure head so that the electrooptic device can be applied to image-forming apparatuses such as printers, copy machines, and facsimile machines.

The present invention is by no means limited to the embodiments described above and may be modified without departing from the essence or the spirit of the invention indicated by the claims and the entire description of the specification. The substrates for electrooptic devices, electrooptic devices having such substrates, the method for making the substrates, and various electronic apparatuses equipped with the electrooptic devices with modifications are encompassed by the present invention.

What is claimed is:

1. An electrooptic device comprising:
   a substrate;
   a plurality of pixel units, each including:
      a pixel electrode;
      an active element for active control of the pixel electrode;
      a conductive layer that is disposed below the pixel electrode and that connects the active element to the pixel electrode;
      an organic resin film that provides interlayer insulation between the active element and the pixel electrode and between the conductive layer and the pixel electrode, the organic resin film having a small hole that overlaps part of the conductive layer in a plan view;
      a first inorganic insulating film disposed between the organic resin film and the conductive layer and between the organic resin film and the active element such that the first inorganic insulating film overlaps the conductive layer and the active element in a plan view, the first inorganic insulating film having a first hole inside the small hole in a plan view, the first hole having a diameter equal to or smaller than the bottom of the small hole; and
      a second inorganic insulating film disposed between the organic resin film and the pixel electrode, the second inorganic insulating film having a second hole that is continuous to the first hole and that forms a contact hole together with the first hole,
   wherein the pixel electrode is formed in a continuous manner from inside the contact hole to outside the contact hole such that the pixel electrode is electrically connected to the conductive layer exposed inside the first hole.

2. The electrooptic device according to claim 1, wherein the organic resin film is composed of photosensitive resin.

3. The electrooptic device according to claim 1 wherein at least one of the first and second inorganic insulating films is composed of a material that contains nitrogen.

4. The electrooptic device according to claim 1, each pixel unit further including:
   a counter electrode that faces the pixel electrode; and
   an electrooptic material interposed between the counter electrode and the pixel electrode.

5. The electrooptic device according to claim 4, wherein the electrooptic material is composed of an organic EL.

6. The electrooptic device according to claim 1, each pixel unit further including a reflector film disposed above the organic resin film and below the second inorganic insulating film, the reflector film overlapping part of the second inorganic insulating film and the pixel electrode in a plan view.

7. An electronic apparatus comprising the electrooptic device according to claim 1.

8. A substrate for an electrooptic device, comprising:
   a substrate; and
   a plurality of pixel units on the substrate, each including:
      a pixel electrode;
      an active element for active control of the pixel electrode;

a conductive layer that is formed below the pixel electrode and that connects the active element to the pixel electrode;

an organic resin film that provides interlayer insulation between the active element and the pixel electrode and between the conductive layer and the pixel electrode, the organic resin film having a small hole that overlaps part of the conductive layer in a plan view;

a first inorganic insulating film disposed between the organic resin film and the conductive layer and between the organic resin film and the active element such that the first inorganic insulating film overlaps the conductive layer and the active element in a plan view, the first inorganic insulating film having a first hole inside the small hole in a plan view, the first hole having a diameter equal to or smaller than the bottom of the small hole; and a second inorganic insulating film disposed between the organic resin film and the pixel electrode, the second inorganic insulating film having a second hole that is continuous to the first hole and that forms a contact hole together with the first hole, wherein the pixel electrode is formed in a continuous manner from inside the contact hole to outside the contact hole such that the pixel electrode is electrically connected to the conductive layer exposed inside the first hole.

9. A method for making an electrooptic device, comprising:

a first step of forming an active element for each of pixel units on a substrate;

a second step of forming a conductor layer electrically connected to the active element;

a third step of forming a first inorganic insulating film above the conductive layer and the active element such that the first inorganic insulating film overlaps the active element and the conductive layer in a plan view;

a fourth step of forming an organic resin film on the first inorganic insulating film;

a fifth step of forming a small hole that penetrates the organic resin film and reaches a surface of the first inorganic insulating film, the small hole being formed in an organic resin film at a position that overlaps part of the conductive layer in a plan view;

a sixth step of forming a second inorganic insulating film on the organic resin film so as to cover a sidewall of the small hole;

a seventh step of forming a first hole inside the small hole, the first hole penetrating the first and second inorganic insulating films to reach a surface of the conductive layer; and an eighth step of forming a pixel electrode on the second inorganic insulating film and the conductive layer exposed in the first hole.

10. The method according to claim 9, wherein:

in the fourth step, the organic resin film is formed using a photosensitive resin; and in the fifth step, the small hole is formed by exposing and developing the organic resin film.

11. The method according to claim 9, further comprising:

after the fourth step and before the sixth step, a step of forming a reflector film on the organic resin film such that the reflector film partly overlaps the pixel electrode, wherein in the sixth step, the second inorganic insulating film is formed on the reflector film.

* * * * *